United States Patent
Park et al.

(10) Patent No.: US 12,408,520 B2
(45) Date of Patent: Sep. 2, 2025

(54) DISPLAY DEVICE

(71) Applicant: Samsung Display Co., LTD., Yongin-si (KR)

(72) Inventors: Junhyun Park, Yongin-si (KR); Hyeongseok Kim, Yongin-si (KR); Heejean Park, Yongin-si (KR); Sunhwa Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/626,030

(22) Filed: Apr. 3, 2024

(65) Prior Publication Data

US 2024/0365607 A1 Oct. 31, 2024

(30) Foreign Application Priority Data

Apr. 27, 2023 (KR) ........................ 10-2023-0055594

(51) Int. Cl.
*G06F 3/038* (2013.01)
*G09G 3/3233* (2016.01)
*H10K 59/126* (2023.01)

(52) U.S. Cl.
CPC ......... *H10K 59/126* (2023.02); *G09G 3/3233* (2013.01); *G09G 2300/0426* (2013.01); *G09G 2300/0819* (2013.01); *G09G 2300/0852* (2013.01); *G09G 2310/08* (2013.01); *G09G 2320/0233* (2013.01)

(58) Field of Classification Search
CPC ............... H10K 59/126; G09G 3/3233; G09G 2300/0426; G09G 2300/0819
USPC .......................................................... 345/204
See application file for complete search history.

(56) References Cited

U.S. PATENT DOCUMENTS

| | | |
|---|---|---|
| 11,195,893 B2 | 12/2021 | Lee et al. |
| 11,574,972 B2 | 2/2023 | Kang et al. |
| 2007/0273619 A1* | 11/2007 | Kitazawa ............. G09G 3/3233 345/76 |
| 2022/0052134 A1* | 2/2022 | Zhang ................... H10K 59/122 |
| 2022/0320212 A1* | 10/2022 | Gui ......................... H10D 64/27 |

(Continued)

FOREIGN PATENT DOCUMENTS

| | | |
|---|---|---|
| KR | 1020210013460 A | 2/2021 |
| KR | 1020210029339 A | 3/2021 |
| KR | 1020220140920 A | 10/2022 |

*Primary Examiner* — Jonathan M Blancha
(74) *Attorney, Agent, or Firm* — CANTOR COLBURN LLP

(57) ABSTRACT

A display device includes: a display panel including a light emitting element and a pixel circuit unit connected to the light emitting element. The pixel circuit unit includes: a first transistor connected between a drive voltage line and the light emitting element and which operates depending on a potential of a first node; a second transistor connected between a data line and a second node; a first capacitor electrode connected to the first node; a second capacitor electrode connected to the second node and which faces the first capacitor electrode; a third capacitor electrode connected to the second node; a fourth capacitor electrode, which faces the third capacitor electrode and is connected to the drive voltage line; a bridge electrode, which connects the second capacitor electrode and the third capacitor electrode; and a shielding electrode, which overlaps the bridge electrode in a plan view.

18 Claims, 23 Drawing Sheets

(56) References Cited

U.S. PATENT DOCUMENTS

2022/0328592 A1 10/2022 You
2023/0081823 A1* 3/2023 Noh .................. H10K 59/1216
257/211

* cited by examiner

DISPLAY DEVICE

This application claims priority to Korean Patent Application No. 10-2023-0055594, filed on Apr. 27, 2023, and all the benefits accruing therefrom under 35 U.S.C. § 119, the content of which in its entirety is herein incorporated by reference.

BACKGROUND

Embodiments of the present disclosure described herein relate to a display device, and more particularly, relate to a display device with improved picture quality.

Among display devices, an emissive display device displays an image using light emitting diodes that generate light by recombination of electrons and holes. The emissive display device has a high response speed and is driven with low power consumption.

The emissive display device includes pixels connected to data lines and scan lines. In general, each of the pixels includes a light emitting diode and a pixel circuit unit for controlling the amount of current flowing to the light emitting diode. In response to a data signal, the pixel circuit unit controls the amount of current flowing from a first drive voltage line to a second drive voltage line via the light emitting diode. At this time, light having a predetermined luminance is generated depending on the amount of current flowing through the light emitting diode.

SUMMARY

Embodiments of the present disclosure provide a display device for improving picture quality when operating in a variable frequency mode.

According to an embodiment, a display device includes a display panel including a light emitting element and a pixel circuit unit connected to the light emitting element. The pixel circuit unit includes: a first transistor connected between a drive voltage line and the light emitting element and which operates depending on a potential of a first node; a second transistor connected between a data line and a second node; a first capacitor electrode electrically connected to the first node; a second capacitor electrode electrically connected to the second node and which faces the first capacitor electrode to form a first capacitor with the first capacitor electrode; a third capacitor electrode electrically connected to the second node; a fourth capacitor electrode electrically connected to the drive voltage line and which faces the third capacitor electrode to form a second capacitor which the third capacitor electrode; a bridge electrode, which electrically connects the second capacitor electrode and the third capacitor electrode; and a shielding electrode disposed over the bridge electrode and which overlaps the bridge electrode in a plan view.

According to an embodiment, a display device includes a display panel including a light emitting element and a pixel circuit unit connected to the light emitting element. The pixel circuit unit includes: a first transistor connected between a drive voltage line and the light emitting element and which operates depending on a potential of a first node; a second transistor connected between a data line and a second node; a first capacitor electrode connected to the first node; a second capacitor electrode and a third capacitor electrode, which are connected to the second node and face the first capacitor electrode to form a first capacitor with the first capacitor electrode, where the second capacitor electrode and the third capacitor electrode are integrally provided with each other; a fourth capacitor electrode, which faces the third capacitor electrode to form a second capacitor with the third capacitor electrode and is connected to the drive voltage line; a bridge electrode, which electrically connects the second capacitor electrode and the second transistor; and a shielding electrode disposed over the bridge electrode and which partially overlaps the second capacitor electrode and the second transistor in a plan view.

BRIEF DESCRIPTION OF THE FIGURES

The above and other aspects and features of the present disclosure will become apparent by describing in detail embodiments thereof with reference to the accompanying drawings.

DETAILED DESCRIPTION

Figure 1:
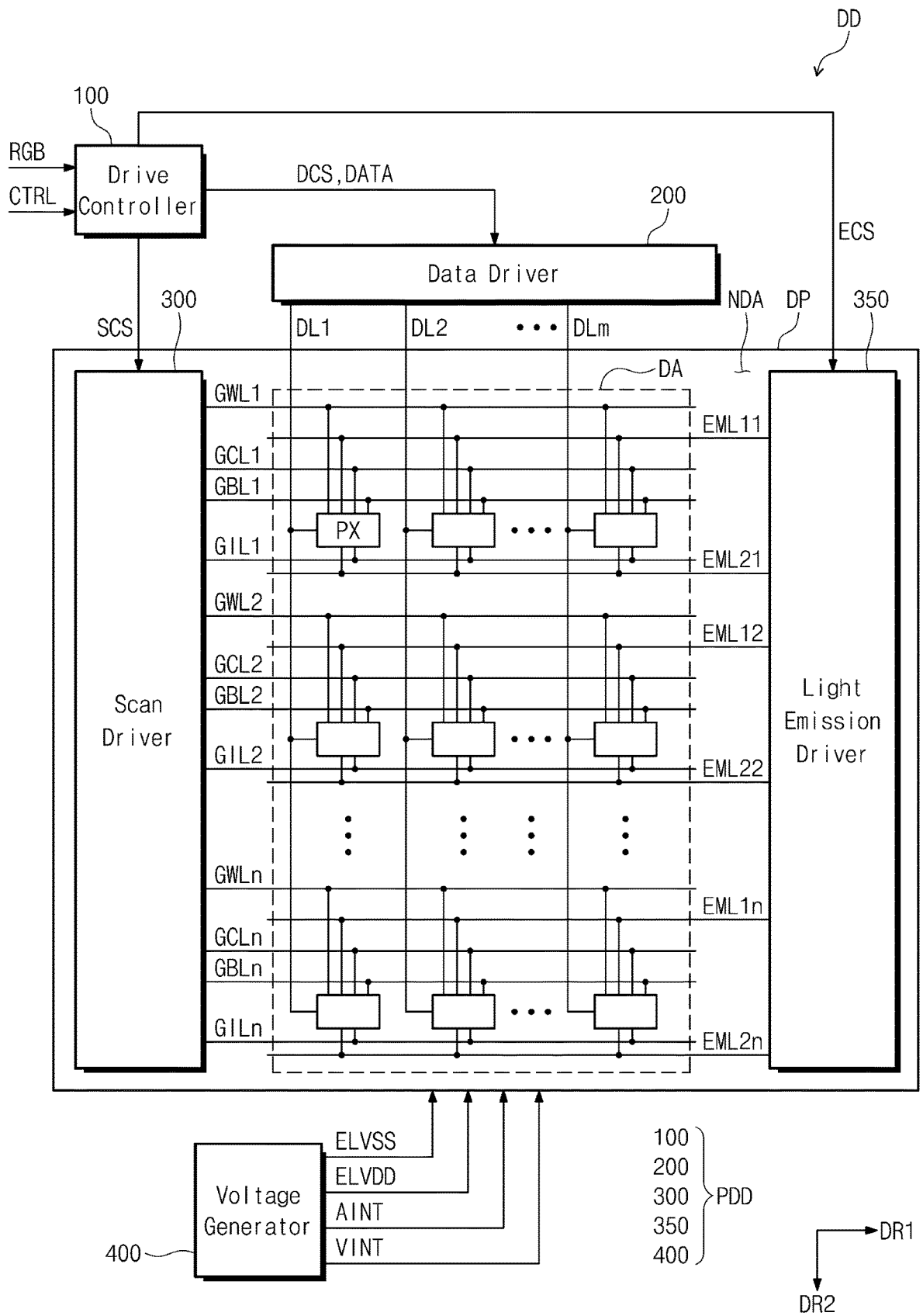
FIG. 1 is a block diagram of a display device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. The terminology used herein is for the purpose of describing particular embodiments only and is not intended to be limiting. As used herein, "a", "an", "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes all of one or more combinations defined by related components.

Terms such as "first", "second", and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the in contextual meanings in the relevant field of art, and are not to be interpreted as having ideal or excessively formal meanings unless clearly defined as having such in the present application.

Hereinafter, embodiments of the present disclosure will be described with reference to the accompanying drawings.

FIG. 1 is a block diagram of a display device according to an embodiment of the present disclosure.

Referring to FIG. 1, the display device DD may be activated depending on an electrical signal and may display an image. The display device DD may be applied to an electronic device such as a smart watch, a tablet computer, a notebook computer, a computer, a smart television, or the like.

The display device DD includes a display panel DP and a panel driver PDD that drives the display panel DP. In an embodiment of the present disclosure, the panel driver PDD may include a drive controller 100, a data driver 200, a scan driver 300, a light emission driver 350, and a voltage generator 400.

The drive controller 100 receives an image signal RGB and a control signal CTRL. The drive controller 100 generates image data DATA by converting the data format of the image signal RGB according to the specification of an interface with the data driver 200. The drive controller 100 outputs a scan control signal SCS, a data control signal DCS, and a light emission drive control signal ECS.

The data driver 200 receives the data control signal DCS and the image data DATA from the drive controller 100. The data driver 200 converts the image data DATA into data signals and outputs the data signals to a plurality of data lines DL1 to DLm that will be described below. The data signals are analog data voltages corresponding to gray level values of the image data DATA.

The voltage generator 400 generates voltages for operation of the display panel DP. In an embodiment of the present disclosure, the voltage generator 400 generates a first drive voltage ELVDD, a second drive voltage ELVSS, a first initialization voltage VINT, and a second initialization voltage AINT. The first initialization voltage VINT and the second initialization voltage AINT may have different voltage levels. In an embodiment of the present disclosure, the voltage generator 400 may additionally generate a reference voltage Vref (refer to FIG. 2A) that is supplied to the display panel DP. The reference voltage Vref may have a lower voltage level than the first drive voltage ELVDD.

The scan driver 300 receives the scan control signal SCS from the drive controller 100. The scan control signal SCS may include a start signal to start operation of the scan driver 300 and a plurality of clock signals. The scan driver 300 generates a plurality of scan signals and sequentially outputs the plurality of scan signals to scan lines that will be described below. The light emission driver 350 may output light emission control signals to light emission control lines EML11 to EML1n and EML21 to EML2n, which will be described below, in response to the light emission drive control signal ECS from the drive controller 100. In an embodiment, the scan driver 300 and the light emission driver 350 may be integrated into one circuit.

The scan driver 300 outputs initialization scan signals to initialization scan lines GIL1 to GILn of the display panel DP and outputs compensation scan signals to compensation scan lines GCL1 to GCLn of the display panel DP. The scan driver 300 outputs write scan signals to write scan lines GWL1 to GWLn of the display panel DP and outputs black scan signals to black scan lines GBL1 to GBLn of the display panel DP.

The display panel DP includes the initialization scan lines GIL1 to GILn, the compensation scan lines GCL1 to GCLn, the write scan lines GWL1 to GWLn, the black scan lines GBL1 to GBLn, the first light emission control lines EML11 to EML1n, the second light emission control lines EML21 to EML2n, the data lines DL1 to DLm, and pixels PX. The display panel DP has a display region DA and a non-display region NDA defined therein. The initialization scan lines GIL1 to GILn, the compensation scan lines GCL1 to GCLn, the write scan lines GWL1 to GWLn, the black scan lines GBL1 to GBLn, the first light emission control lines EML11 to EML1n, the second light emission control lines EML21 to EML2n, the data lines DL1 to DLm, and the pixels PX may be disposed in the display region DA. The initialization scan lines GIL1 to GILn, the compensation scan lines GCL1 to GCLn, the write scan lines GWL1 to GWLn, the black scan lines GBL1 to GBLn, the first light emission control lines EML11 to EML1n, and the second light emission control lines EML21 to EML2n extend in a first direction DR1 and are arranged in a second direction DR2 so as to be spaced apart from each other. The data lines DL1 to DLm extend in the second direction DR2 and are arranged in the first direction DR1 so as to be spaced apart from each other.

The scan driver 300 and the light emission driver 350 may be disposed in the non-display region NDA of the display panel DP. In an embodiment of the present disclosure, the scan driver 300 is disposed adjacent to one side of the display region DA, and the light emission driver 350 is disposed adjacent to an opposite side of the display region DA that faces away from the one side. Although the scan driver 300 and the light emission driver 350 are disposed on the opposite sides of the display region DA in the embodiment illustrated in FIG. 1, the present disclosure is not limited thereto. In another embodiment, for example, the scan driver 300 and the light emission driver 350 may be disposed adjacent to one of the one side and the opposite side of the display panel DP.

The plurality of pixels PX are electrically connected to the initialization scan lines GIL1 to GILn, the compensation scan lines GCL1 to GCLn, the write scan lines GWL1 to GWLn, the black scan lines GBL1 to GBLn, the first light emission control lines EML11 to EML1n, the second light emission control lines EML21 to EML2n, and the data lines DL1 to DLm. Each of the plurality of pixels PX may be electrically connected to four scan lines and two light emission control lines. In an embodiment, for example, as illustrated in FIG. 1, a first row of pixels may be connected to a first initialization scan line GIL1, a first compensation scan line GCL1, a first write scan line GWL1, a first black scan line GBL1, a first-first light emission control line EML11, and a second-first light emission control line EML21. In addition, a second row of pixels may be connected to a second initialization scan line GIL2, a second compensation scan line GCL2, a second write scan line GWL2, a second black scan line GBL2, a first-second light emission control line EML12, and a second-second emission control line EML22. However, without being limited thereto, the numbers of scan lines and light emission control lines connected to each pixel PX may be varied.

Each of the plurality of pixels PX includes a light emitting element ED (refer to FIG. 2A) and a pixel circuit unit PXC (refer to FIG. 2A) that controls light emission of the light emitting element ED. The pixel circuit unit PXC may include one or more transistors and one or more capacitors. The scan driver 300 and the light emission driver 350 may be directly disposed in the non-display region NDA of the display panel DP through the same process as the transistors of the pixel circuit unit PXC.

Each of the plurality of pixels PX receives the first drive voltage ELVDD, the second drive voltage ELVSS, and the first and second initialization voltages VINT and AINT from the voltage generator 400. Alternatively, each of the plurality of pixels PX may additionally receive the reference voltage Vref from the voltage generator 400.

Figure 2A:
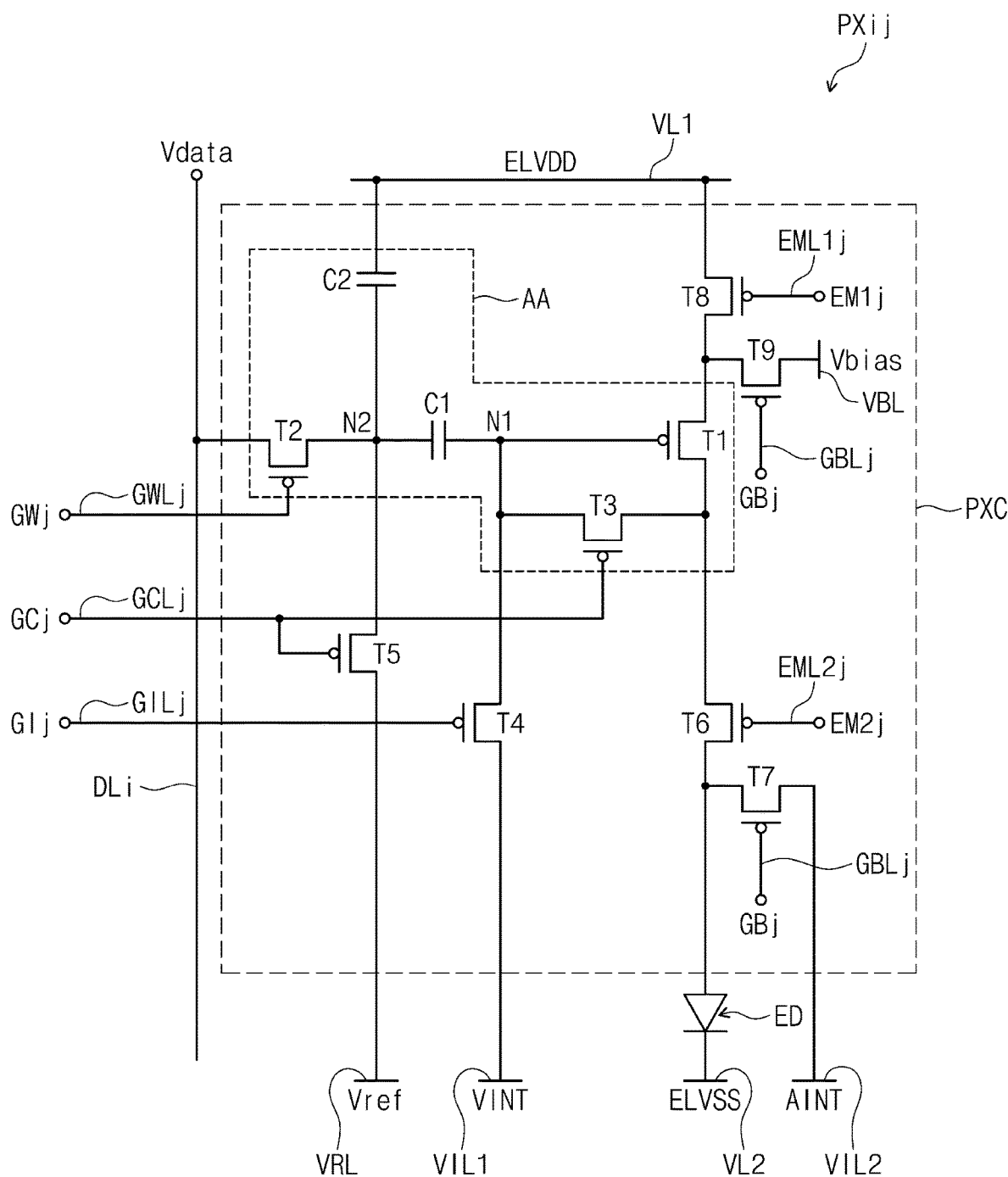
FIG. 2A is a circuit diagram of a pixel according to an embodiment of the present disclosure.
Figure 2B:
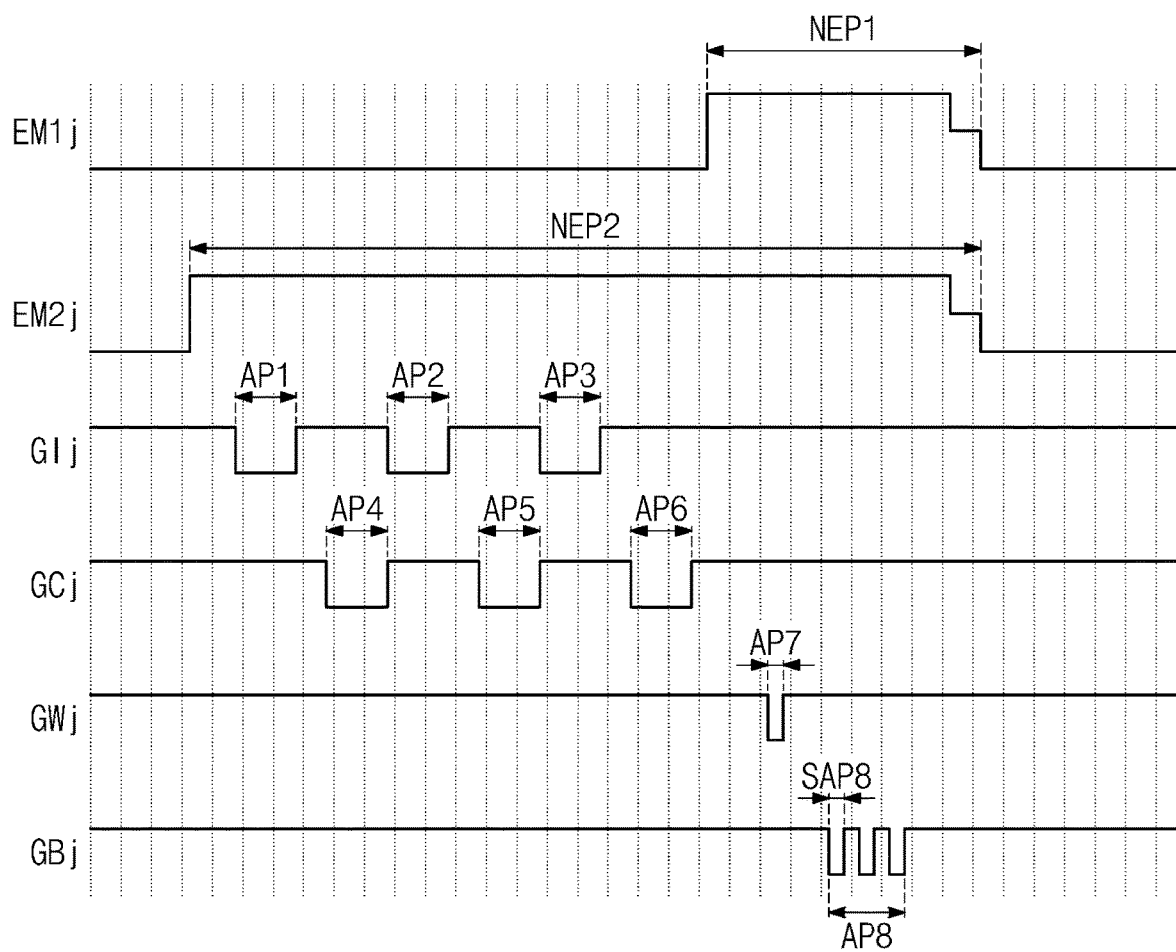
FIG. 2B is a timing chart for explaining operation of the pixel according to an embodiment of the present disclosure.

FIG. 2A is a circuit diagram of a pixel according to an embodiment of the present disclosure, and FIG. 2B is a timing chart for explaining operation of the pixel according to an embodiment of the present disclosure.

The pixels PX illustrated in FIG. 1 may have the same configuration. Accordingly, the configuration of one pixel PXij among the pixels PX will be described with reference to FIG. 2A, and descriptions of the configurations of the remaining pixels will be omitted.

Referring to FIG. 2A, the pixel PXij is connected to a j-th initialization scan line GILj among the initialization scan lines GIL1 to GILn, a j-th compensation scan line among the compensation scan lines GCL1 to GCLn, a j-th write scan line among the write scan lines GWL1 to GWLn, and a j-th black scan line among the black scan lines GBL1 to GBLn illustrated in FIG. 1. In addition, the pixel PXij is connected to an i-th data line DLi among the data lines DL1 to DLm illustrated in FIG. 1. The pixel PXij is connected to a first-(j-th) light emission control line EML1j among the first light emission control lines EML11 to EML1n and connected to second-(j-th) light emission control line EML2j among the second light emission control lines EML21 to EML2n.

Referring to FIG. 2A, the pixel PXij according to an embodiment includes the pixel circuit unit PXC and the light emitting element ED. In an embodiment of the present disclosure, the pixel circuit unit PXC may include nine transistors and two capacitors. Hereinafter, the nine transistors are referred to as the first to ninth transistors T1, T2, T3, T4, T5, T6, T7, T8, and T9, and the two capacitors are referred to as the first and second capacitors C1 and C2.

In this embodiment, each of the first to ninth transistors T1 to T9 is a P-type transistor having a low-temperature polycrystalline silicon ("LTPS") semiconductor layer. Alternatively, each of the first to ninth transistors T1 to T9 may be an N-type transistor. In another case, at least one of the first to ninth transistors T1 to T9 may be an N-type transistor, and the remaining transistors may be P-type transistors. At least one of the first to ninth transistors T1 to T9 may be a transistor having an oxide semiconductor layer. In an embodiment, for example, some of the first to ninth transistors T1 to T9 may be oxide semiconductor transistors, and the remaining transistors may be LTPS transistors.

The circuit configuration of the pixel PXij according to the present disclosure is not limited to the circuit configuration illustrated in FIG. 2A. The pixel PXij illustrated in FIG. 2A is merely illustrative, and various changes and modifications may be made to the circuit configuration of the pixel PXij.

The j-th initialization scan line GILj supplies the j-th initialization scan signal GIj to the pixel PXij. The j-th write scan line GWLj supplies the j-th write scan signal GWj to the pixel PXij, and the j-th compensation scan line GCLj supplies the j-th compensation scan signal GCj to the pixel PXij. The first-(j-th) light emission control line EML1j supplies the first-(j-th) light emission control signal EM1j to the pixel PXij, the second-(j-th) light emission control line EML2j supplies the second-(j-th) light emission control signal EM2j to the pixel PXij, and the i-th data line DLi transfers the i-th data voltage Vdata to the pixel PXij. The i-th data voltage Vdata may have a voltage level corresponding to the image data DATA that is input to the display device DD (refer to FIG. 1).

The pixel PXij may be connected to a first drive voltage line VL1, a second drive voltage line VL2, a first initialization voltage line VIL1, a second initialization voltage line VIL2, a reference voltage line VRL, and a bias voltage line VBL.

The first drive voltage line VL1 transfers, to the pixel PXij, the first drive voltage ELVDD supplied from the voltage generator 400 illustrated in FIG. 1, and the second drive voltage line VL2 transfers, to the pixel PXij, the second drive voltage ELVSS supplied from the voltage generator 400. The first initialization voltage line VIL1 and the second initialization voltage line VIL2 receive the first initialization voltage VINT and the second initialization voltage AINT from the voltage generator 400 and transfer the first initialization voltage VINT and the second initialization voltage AINT to the pixel PXij. The reference voltage line VRL receives the reference voltage Vref from the voltage generator 400 and transfers the reference voltage Vref to the pixel PXij. The bias voltage line VBL receives a bias voltage Vbias from the voltage generator 400 (refer to FIG. 1) and transfers the bias voltage Vbias to the pixel PXij.

Each of the first to ninth transistors T1 to T9 may include an input electrode (or, a source electrode), an output electrode (or, a drain electrode), and a control electrode (or, a gate electrode). In this specification, for convenience, the input electrode, the output electrode, and the control electrode may be referred to as the first electrode, the second electrode, and the third electrode.

The first transistor T1 (or, referred to as the drive transistor) may be provided between the first drive voltage line VL1 and the light emitting element ED. Specifically, the first transistor T1 includes the first electrode electrically connected to the first drive voltage line VL1, the second electrode electrically connected to the light emitting element ED, and the third electrode connected to a first node N1. The first transistor T1 may receive the first drive voltage ELVDD through the first drive voltage line VL1. The first electrode (See S1 in FIG. 4) of the first transistor T1 may be connected to the first drive voltage line VL1 via the eighth transistor T8, and the second electrode (See D1 in FIG. 4) of the first transistor T1 may be electrically connected to an anode of the light emitting element ED via the sixth transistor T6.

The second transistor T2 may be connected between the i-th data line DLi and a second node N2. Specifically, the second transistor T2 includes the first electrode connected to the i-th data line DLi, the second electrode connected to the second node N2, and the third electrode that receives the j-th write scan signal GWj through the j-th write scan line GWLj. During a data write period AP7 (refer to FIG. 2B), the second transistor T2 is turned on in response to the j-th write scan signal GWj provided to the j-th write scan line GWLj. The i-th data line DLi and the second node N2 may be electrically connected by the turned-on second transistor T2, and the i-th data voltage Vdata applied to the i-th data line DLi may be applied to the second node N2 through the turned-on second transistor T2. The data write period AP7 may be referred to as a seventh active period AP7.

The first capacitor C1 is connected between the first node N1 and the second node N2, and the second capacitor C2 is connected between the second node N2 and the first drive voltage line VL1. The first capacitor C1 includes a first electrode electrically connected to the first node N1 and a second electrode electrically connected to the second node N2. The second capacitor C2 includes a first electrode electrically connected to the first drive voltage line VL1 and a second electrode electrically connected to the second node N2.

The third transistor T3 is connected between the second electrode of the first transistor T1 and the third electrode (See G1 in FIG. 4) of the first transistor T1. Specifically, the third transistor T3 includes the first electrode electrically connected to the second electrode of the first transistor T1, the second electrode electrically connected to the first node N1, and the third electrode that receives the j-th compensation scan signal GCj through the j-th compensation scan line GCLj. During compensation periods AP4, AP5, and AP6 (refer to FIG. 2B), the third transistor T3 is turned on in response to the j-th compensation scan signal GCj provided to the j-th compensation scan line GCLj. During the compensation periods AP4, AP5, and AP6, the first transistor T1 may be connected in a diode form by the turned-on third transistor T3. In this embodiment, the compensation periods AP4, AP5, and AP6 include a fourth active period AP4, a fifth active period AP5, and a sixth active period AP6.

The fourth transistor T4 (or, referred to as a first initialization transistor) is electrically connected between the first node N1 and the first initialization voltage line VIL1. Specifically, the fourth transistor T4 includes the first electrode electrically connected to the first node N1, the second electrode electrically connected to the first initialization voltage line VIL1, and the third electrode that receives the j-th initialization scan signal GIj through the j-th initialization scan line GILj. The first initialization voltage VINT may be applied to the first initialization voltage line VIL1. During initialization periods AP1, AP2, and AP3 (refer to FIG. 2B), the fourth transistor T4 is turned on in response to the j-th initialization scan signal GIj provided to the j-th initialization scan line GILj. During the initialization periods AP1, AP2, and AP3, the first node N1 may be initialized to the first initialization voltage VINT by the turned-one fourth transistor T4. In this embodiment, the initialization periods AP1, AP2, and AP3 include a first active period AP1, a second active period AP2, and a third active period AP3.

The fifth transistor T5 may be electrically connected between the second node N2 and the reference voltage line VRL. The reference voltage line VRL may receive the reference voltage Vref from the voltage generator 400 illustrated in FIG. 1 and may supply the reference voltage Vref to the pixel PXij. The reference voltage Vref may have a lower voltage level than the first drive voltage ELVDD. The fifth transistor T5 includes the first electrode connected to the reference voltage line VRL, the second electrode electrically connected to the second node N2, and the third electrode that receives the j-th compensation scan signal GCj through the j-th compensation scan line GCLj. During the compensation periods AP4, AP5, and AP6, the fifth transistor T5 is turned on in response to the j-th compensation scan signal GCj provided to the j-th compensation scan line GCLj. The first drive voltage line VL1 and the second node N2 are electrically connected by the turned-on fifth transistor T5. That is, during the compensation periods AP4, AP5, and AP6, the reference voltage Vref may be applied to the second node N2.

In an embodiment of the present disclosure, the third electrodes of the third and fifth transistors T3 and T5 are commonly connected to the j-th compensation scan line GCLj. However, the present disclosure is not limited thereto. That is, the third electrode of the third transistor T3 and the third electrode of the fifth transistor T5 may be connected to different scan lines and may receive different scan signals in another embodiment.

The sixth transistor T6 (or, referred to as a first light emission control transistor) is connected between the second electrode of the first transistor T1 and the anode of the light emitting element ED. Specifically, the sixth transistor T6 includes the first electrode connected to the second electrode of the first transistor T1, the second electrode electrically connected to the anode of the light emitting element ED, and the third electrode electrically connected to the second-(j-th) light emission control line EML2j. During a second non-light emission period NEP2, the sixth transistor T6 may be turned on by the second-(j-th) light emission control signal EM2j provided to the second-(j-th) light emission control line EML2j.

The seventh transistor T7 (or, referred to as a second initialization transistor) is connected between the second initialization voltage line VIL2 and the anode of the light emitting element ED. The seventh transistor T7 includes the first electrode connected to the anode of the light emitting element ED, the second electrode connected to the second initialization voltage line VIL2, and the third electrode that receives the j-th black scan signal GBj (or, referred to as an initialization control signal) through the j-th black scan line GBLj. The second initialization voltage AINT may be applied to the second initialization voltage line VIL2. In an embodiment of the present disclosure, the second initialization voltage AINT has a voltage level different from a voltage level of the first initialization voltage VINT. During a black period AP8 (refer to FIG. 2B), the seventh transistor T7 is turned on in response to the j-th black scan signal GBj provided to the j-th black scan line GBLj. During the black period AP8, the anode of the light emitting element ED may be initialized to the second initialization voltage AINT by the turned-on seventh transistor T7. Alternatively, the third electrode of the seventh transistor T7 may be connected to the (j+1)th write scan line and may receive the (j+1)th write scan signal as the j-th black scan signal GBj. The black period AP8 may be referred to as an eighth active period AP8.

The eighth transistor T8 may be electrically connected between the first transistor T1 and the first drive voltage line VL1. Specifically, the eighth transistor T8 includes the first electrode electrically connected to the first drive voltage line VL1, the second electrode electrically connected to the first electrode of the first transistor T1, and the third electrode that receives the first-(j-th) light emission control signal EM1j through the first-(j-th) light emission control line EML1j. During a first non-light emission period NEP1, the eighth transistor T8 may be turned on by the first-(j-th) light emission control signal EM1j provided to the first-(j-th) light emission control line EML1j.

The ninth transistor T9 may be electrically connected between the first transistor T1 and the bias voltage line VBL. Specifically, the ninth transistor T9 includes the first electrode electrically connected to the bias voltage line VBL, the second electrode electrically connected to the first electrode of the first transistor T1, and the third electrode that receives the j-th black scan signal GBj through the j-th black scan line GBLj. During the black period AP8, the ninth transistor T9 is turned on in response to the j-th black scan signal GBj provided to the j-th black scan line GBLj. During the black period AP8, the bias voltage Vbias may be applied to the first electrode of the first transistor T1 through the turned-on ninth transistor T9.

The light emitting element ED may be electrically connected between the sixth transistor T6 and the second drive voltage line VL2. The anode of the light emitting element ED is connected to the second electrode of the sixth transistor T6, and a cathode of the light emitting element ED is connected to the second drive voltage line VL2. The second drive voltage ELVSS may be applied to the second drive voltage line VL2. The second drive voltage ELVSS has a lower level than the first drive voltage ELVDD. Accordingly, the light emitting element ED may emit light depending on a voltage corresponding to a difference between a signal transferred through the sixth transistor T6 and the second drive voltage EVLSS.

Although only the j-th scan signals GIj, GCj, GWj, and GBj, the first-(j-th) light emission control signal EM1j, and the second-(j-th) light emission control signal EM2j are illustrated in FIG. 2B, the remaining scan signals and the remaining light emission control signals also similarly operate, and therefore detailed descriptions thereabout will be omitted.

Referring to FIGS. 2A and 2B, the first-(j-th) light emission control signal EM1j includes the first non-light emission period NEP1, and the second-(j-th) light emission control signal EM2j includes the second non-light emission period NEP2. In an embodiment of the present disclosure, the first and second non-light emission periods NEP1 and NEP2 may overlap each other. The duration time of the second non-light emission period NEP2 may be greater than the duration time of the first non-light emission period NEP1. The first non-light emission period NEP1 may be defined as an inactive period (or, a high-level period) of the first-(j-th) light emission control signal EM1j, and the second non-light emission period NEP2 may be defined as an inactive period (or, a high-level period) of the second-(j-th) light emission control signal EM2j. A low-level period of the second-(j-th) light emission control signal EM2j may be defined as a light emission period.

The j-th initialization scan signal GIj may have the first, second, and third active periods AP1, AP2, and AP3 (that is, the low level periods) during the second non-light emission period NEP2. The j-th initialization scan signal GIj is supplied to the fourth transistor T4 through the j-th initialization scan line GILj, and the fourth transistor T4 is turned on during the first to third active periods AP1, AP2, and AP3 in which the j-th initialization scan signal GIj is activated. During the first to third active periods AP1, AP2, and AP3, the potential (i.e., voltage) of the first node N1 may be initialized to the first initialization voltage VINT by the turned-one fourth transistor T4. That is, as the j-th initialization scan signal GIj includes the three active periods AP1, AP2, and AP3, the first node N1 may be initialized three times within the second non-light emission period NEP2. Each of the first to third active periods AP1, AP2, and AP3 may be defined as an initialization period.

Among the j-th scan signals GIj, GCj, GWj, and GBj, the j-th compensation scan signal GCj may have the fourth, fifth, and sixth active periods AP4, AP5, and AP6 during the second non-light emission period NEP2.

When the j-th compensation scan signal GCj is supplied to the third and fifth transistors T3 and T5 through the j-th compensation scan line GCLj, the third and fifth transistors T3 and T5 are turned on in the fourth to sixth active periods AP4, AP5, and AP6. The first transistor T1 is diode-connected by the turned-on third transistor T3 and is forward-biased. Then, a compensation voltage "ELVDD-Vth" obtained by subtracting the threshold voltage Vth of the first transistor T1 from the first drive voltage ELVDD may be applied to the first node N1. That is, the potential of the first node N1 may be compensated with the compensation voltage "ELVDD-Vth" in the fourth to sixth active periods AP4, AP5, and AP6. The reference voltage Vref is applied to the second node N2 through the turned-on fifth transistor T5 during the fourth to sixth active periods AP4, AP5, and AP6.

The fourth to sixth active periods AP4, AP5, and AP6 may be defined as a compensation period. The duration time of each of the fourth to sixth active periods AP4, AP5, and AP6 may be equal to the duration time of each of the first to third active periods AP1, AP2, and AP3.

Among the j-th scan signals GIj, GCj, GWj, and GBj, the j-th write scan signal GWj may have the seventh active period AP7 during the second non-light emission period NEP2, and the j-th black scan signal GBj may have the eighth active period AP8 during the second non-light emission period NEP2.

The j-th write scan signal GWj is supplied to the second transistor T2 through the j-th write scan line GWLj, and the second transistor T2 is turned on in the seventh active period AP7. The i-th data voltage Vdata may be applied to the second node N2 through the turned-on second transistor T2. Then, the potential of the second node N2 is changed from the first drive voltage ELVDD to the i-th data voltage Vdata. The potential of the first node N1 is also changed by coupling of the first capacitor C1. The seventh active period AP7 may be referred to as a data write period.

The j-th black scan signal GBj is supplied to the seventh transistor T7 and the ninth transistor T9 through the j-th black scan line GBLj, and the seventh transistor T7 and the ninth transistor T9 are turned on during the eighth active period AP8. During the eighth active period AP8, the second initialization voltage AINT may be applied to the anode of the light emitting element ED through the turned-on seventh transistor T7. Then, the anode of the light emitting element ED may be initialized to the second initialization voltage AINT. Furthermore, during the eighth active period AP8, the bias voltage Vbias may be applied to the first electrode of the first transistor T1 through the turned-on ninth transistor T9.

The eighth active period AP8 may be referred to as a black period. The eighth active period AP8 may include a plurality of sub-active periods SAP8. In an embodiment of the present disclosure, a case in which the eighth active period AP8 includes three sub-active periods SAP8 is illustrated in FIG. 2B. However, the number of sub-active periods SAP8 is not limited thereto.

In an embodiment of the present disclosure, each of the sub-active periods SAP8 has the same duration time as the seventh active period AP7. Furthermore, the duration time of each of the first to sixth active periods AP1 to SP6 may be greater than or equal to the duration time of each of the seventh and eighth active periods AP7 and AP8. Although FIG. 2B illustrates an example that the duration time of each of the first to sixth active periods AP1 to AP6 is two times greater than the duration time of the seventh active period AP7, the present disclosure is not limited thereto. Alternatively, the duration time of each of the first to sixth active periods AP1 to AP6 may be three or four times greater than the duration time of the seventh active period AP7.

Figure 3A:
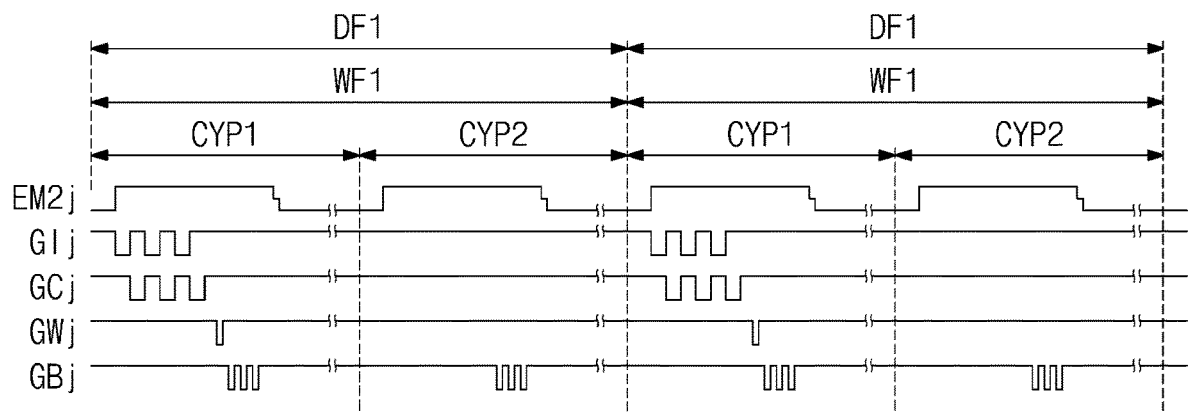
FIG. 3A is a timing chart for explaining the display device operating at a first drive frequency in a variable frequency mode according to an embodiment of the present disclosure.
Figure 3B:
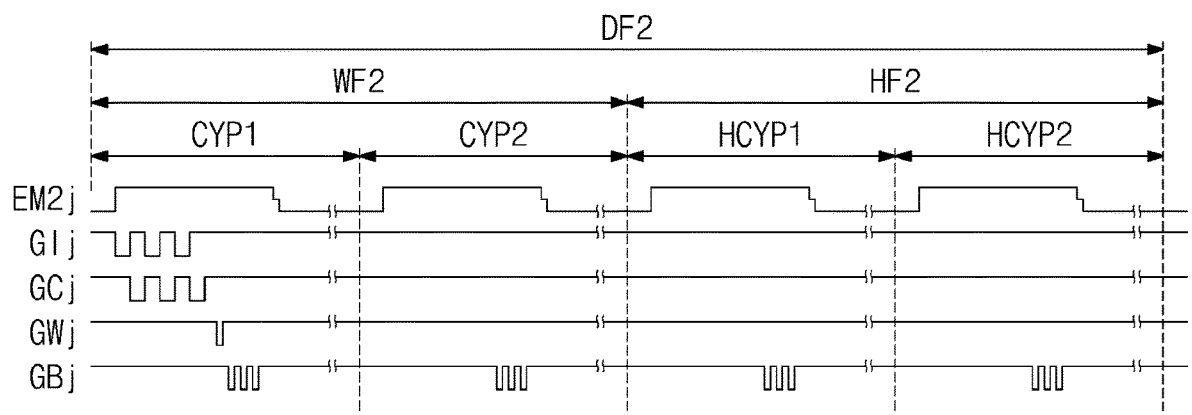
FIG. 3B is a timing chart for explaining the display device operating at a second drive frequency in the variable frequency mode according to an embodiment of the present disclosure.

FIG. 3A is a timing chart for explaining the display device operating at a first drive frequency in a variable frequency mode according to an embodiment of the present disclosure, and FIG. 3B is a timing chart for explaining the display device operating at a second drive frequency in the variable frequency mode according to an embodiment of the present disclosure.

Referring to FIGS. 1, 3A, and 3B, the display device DD may operate in a normal frequency mode (or, a first mode) in which a drive frequency is fixed (or, not varied), or may operate in a variable frequency mode (or, a second mode) in which a drive frequency is varied. In the variable frequency mode, the drive frequency may be varied depending on a frame rate. FIG. 3A illustrates the case in which the display device DD operates at the first drive frequency in the variable frequency mode, and FIG. 3B illustrates the case in which the display device DD operates at the second drive frequency in the variable frequency mode. In an embodiment of the present disclosure, the first drive frequency may be the highest drive frequency at which the display device DD is capable of operating. In an embodiment, for example, the first drive frequency may be 240 Hz or 480 Hz. The first drive frequency may be referred to as the reference frequency or the maximum frequency. The second drive frequency may be a frequency lower than the first drive frequency. In an embodiment of the present disclosure, the second drive frequency may be a frequency corresponding to one of compensation frequencies preset in the panel driver PDD (e.g., the drive controller 100).

As illustrated in FIGS. 1 and 3A, when the display device DD operates at the first drive frequency in the variable frequency mode, the scan signals GIj, GCj, GWj, and GBj and the light emission control signals EM1j and EM2j may be activated within a first drive frame DF1. In an embodiment of the present disclosure, an active period in which each of the scan signals GIj, GCj, GWj, and GBj and the light emission control signals EM1j and EM2j is activated may be defined as a low level period, and an inactive period in which each of the scan signals GIj, GCj, GWj, and GBj and the light emission control signals EM1j and EM2j is deactivated may be defined as a high level period. In an embodiment of the present disclosure, the first drive frame DF1 may include a first write frame WF1. The first write frame WF1 may include a first cycle section CYP1 and a second cycle section CYP2.

Among the scan signals GIj, GCj, GWj, and GBj, the scan signals GIj, GCj, and GWj may be activated only in the first cycle section CYP1 and may remain in a deactivated state in the second cycle section CYP2. In an embodiment of the present disclosure, the black scan signal GBj and the light emission control signals EM1j and EM2j may be activated in the first and second cycle sections CYP1 and CYP2. The j-th initialization scan signal GIj, the j-th compensation scan signal GCj, and the j-th write scan signal GWj may be activated only in the first cycle section CYP1. That is, the j-th black scan signal GBj, the first-(j-th) light emission control signal EM1j, and the second-(j-th) light emission control signal EM2j are activated in units of one cycle section, and the j-th initialization scan signal GIj, the j-th compensation scan signal GCj, and the j-th write scan signal GWj are activated in units of one first write frame WF1. Accordingly, the frequencies of the j-th black scan signal GBj, the first-(j-th) light emission control signal EM1j, and the second-(j-th) light emission control signal EM2j may be greater than the frequencies of the j-th initialization scan signal GIj, the j-th compensation scan signal GCj, and the j-th write scan signal GWj.

As illustrated in FIGS. 1, 2B, and 3B, the display device DD may operate at the second drive frequency different from the first drive frequency in the variable frequency mode. In an embodiment of the present disclosure, the second drive frequency may be lower than the first drive frequency. In an embodiment, for example, the second drive frequency may be about 48 Hz or about 96 Hz. When the display device DD operates at the second drive frequency, the scan signals GIj, GCj, GWj, and GBj and the light emission control signals EM1j and EM2j may be activated within a second drive frame DF2.

In an embodiment of the present disclosure, the second drive frame DF2 may include a second write frame WF2 and at least one holding frame HF2. The duration time of the second write frame WF2 may be equal to the duration time of the first write frame WF1. The duration time of the holding frame HF2 may be equal to the duration time of the second write frame WF2. The number of holding frames HF2 included in the second drive frame DF2 may vary depending on the magnitude of the second drive frequency.

Among the scan signals GIj, GCj, GWj, and GBj, the scan signals GIj, GCj, and GWj may be activated only within the second write frame WF2 and may remain in a deactivated state in the holding frame HF2. The second write frame WF2 may include a first cycle section CYP1 and a second cycle section CYP2. The holding frame HF2 may include a first holding cycle section HCYP1 and a second holding cycle section HCYP2. In an embodiment of the present disclosure, each of the first and second holding cycle sections HCYP1 and HCYP2 may have the same duration time as the first and second cycle sections CYP1 and CYP2.

Among the scan signals GIj, GCj, GWj, and GBj, the scan signals GIj, GCj, and GWj may be activated only in the first cycle section CYP1 of the second write frame WF2 and may remain in a deactivated state in the second cycle section CYP2. The black scan signal GBj and the light emission control signals EM1j and EM2j may be activated within the second write frame WF2 and the holding frame HF2. That is, the j-th black scan signal GBj, the first-(j-th) light emission control signal EM1j, and the second-(j-th) light emission control signal EM2j are activated in units of one cycle section, and the j-th initialization scan signal GIj, the j-th compensation scan signal GCj, and the j-th write scan signal GWj are activated in units of one second write frame WF2. Accordingly, the frequencies of the j-th black scan signal GBj, the first-(j-th) light emission control signal EM1j, and the second-(j-th) light emission control signal EM2j may be greater than the frequencies of the j-th initialization scan signal GIj, the j-th compensation scan signal GCj, and the j-th write scan signal GWj.

Figure 4:
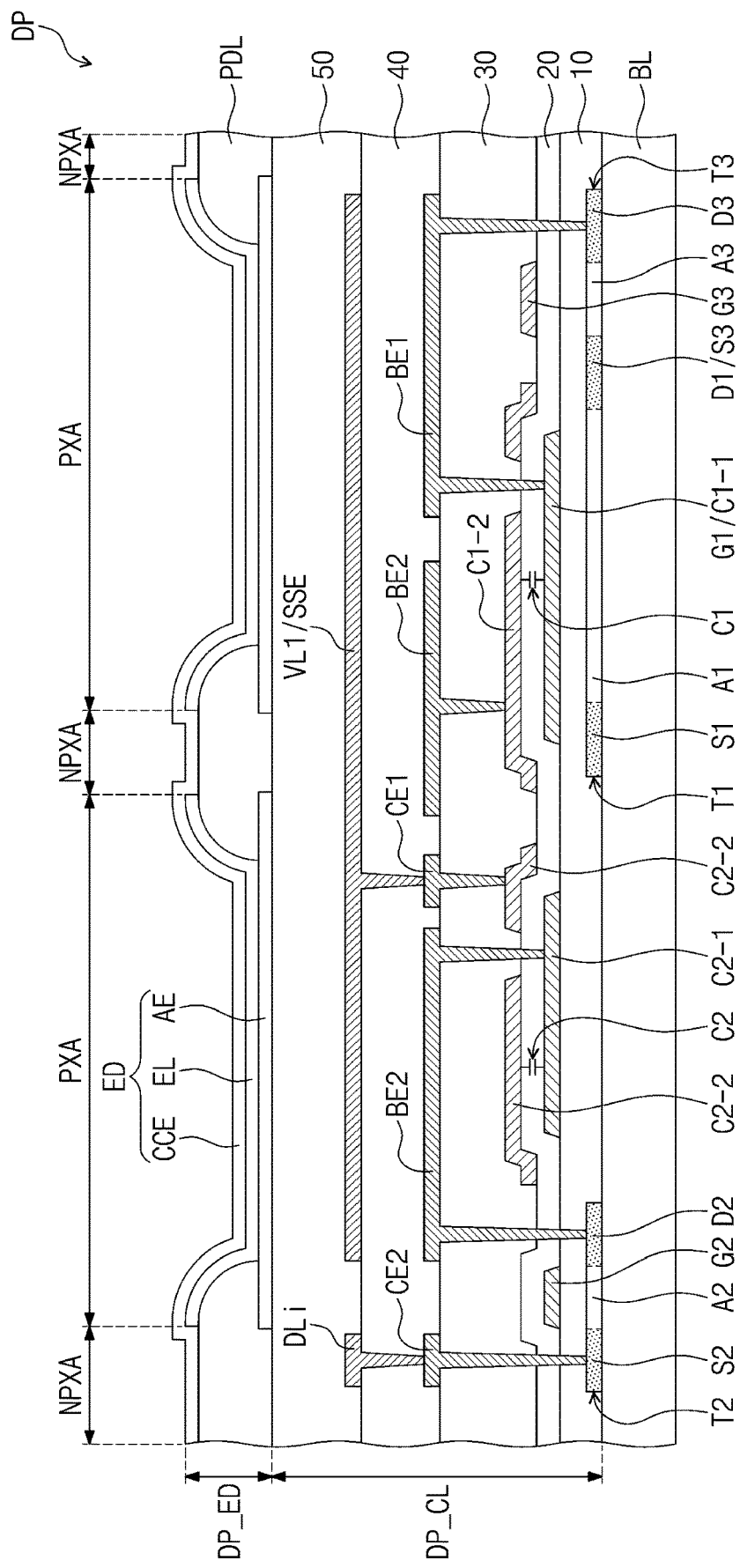
FIG. 4 is a cross-sectional view of a display panel according to an embodiment of the present disclosure.

FIG. 4 is a cross-sectional view of the display panel according to an embodiment of the present disclosure. In particular, FIG. 4 illustrates a sectional structure of portion AA of the pixel PXij illustrated in FIG. 2A.

Referring to FIG. 4, the display panel DP may include a base layer BL, a circuit layer DP_CL, and an element layer DP_ED.

The base layer BL may include a synthetic resin layer. The synthetic resin layer may include a thermosetting resin. In particular, the synthetic resin layer may be a polyimide-based resin layer, and the material thereof is not particularly limited. The synthetic resin layer may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, or a perylene-based resin. In addition, the base layer BL may include a glass substrate, a metal substrate, or an organic/inorganic composite substrate.

At least one inorganic layer may be disposed on an upper surface of the base layer BL. The inorganic layer may include at least one of aluminum oxide, titanium oxide, silicon oxide, silicon oxy-nitride, zirconium oxide, or hafnium oxide. The inorganic layer may be formed of multiple layers. The multiple inorganic layers may constitute a barrier layer and/or a buffer layer. The barrier layer and the buffer layer may be selectively disposed.

The barrier layer BRL prevents infiltration of foreign matter from the outside. The barrier layer BRL may include a silicon oxide layer and a silicon nitride layer. A plurality of silicon oxide layers and a plurality of silicon nitride layers may be provided. The silicon oxide layers and the silicon nitride layers may be alternately stacked one above another.

The buffer layer may be disposed on the barrier layer. The buffer layer improves a coupling force between the base layer and a semiconductor pattern and/or a conductive pattern. The buffer layer may include silicon oxide layers and silicon nitride layers. The silicon oxide layers and the silicon nitride layers may be alternately stacked one above another. The barrier layer and the buffer layer may be omitted.

The circuit layer DP_CL is disposed on the base layer BL. The circuit layer DP_CL includes first to third semiconductor patterns disposed on the base layer BL. The first to third semiconductor patterns may include a silicon semiconductor. The first to third semiconductor patterns may include poly silicon. However, without being limited thereto, the first to third semiconductor patterns may include amorphous silicon or an oxide semiconductor in another embodiment.

The first to third semiconductor patterns have different electrical properties depending on whether the first to third semiconductor patterns are doped or not. Each of the first to third semiconductor patterns may include a doped region and an undoped region. The doped region may be doped with an N-type dopant or a P-type dopant. A P-type transistor includes a doped region doped with a P-type dopant, and an N-type transistor includes a doped region doped with an N-type dopant.

The doped region has a higher conductivity than the undoped region and substantially serves as an electrode or a signal line. The undoped region substantially corresponds to a channel part of a transistor. In other words, one portion of each of the first to third semiconductor patterns may be a channel part of a transistor, another portion of each of the first to third semiconductor patterns may be a source or drain of the transistor, and still another portion may be a connecting signal line (or, a connecting electrode).

As illustrated in FIG. 4, the first electrode S1, a channel part A1, and the second electrode D1 of the first transistor T1 are formed from the first semiconductor pattern. The first electrode S1 and the second electrode D1 of the first transistor T1 extend from the channel part A1 in opposite directions. The first electrode S2, a channel part A2, and the second electrode D2 of the second transistor T2 are formed from the second semiconductor pattern. The first electrode S2 and the second electrode D2 of the second transistor T2 extend from the channel part A2 in opposite directions. The first electrode S3, a channel part A3, and the second electrode D3 of the third transistor T3 are formed from the third semiconductor pattern. The first electrode S3 and the second electrode D3 of the third transistor T3 extend from the channel part A3 in opposite directions. The first electrode S3 of the third transistor T3 and the second electrode D1 of the first transistor T1 may be integrally formed (i.e., integrally provided) with each other.

A first insulating layer 10 (or, a gate insulating layer) is disposed on the base layer BL. The first insulating layer 10 commonly overlaps the plurality of pixels PX and covers the first to third semiconductor patterns in a plan view. The first insulating layer 10 may be an inorganic layer and/or an organic layer and may have a single-layer structure or a multi-layer structure. The first insulating layer 10 may include at least one of aluminum oxide, titanium oxide, silicon oxide, silicon oxy-nitride, zirconium oxide, or hafnium oxide. In this embodiment, the first insulating layer 10 may be a single silicon oxide layer. Not only the first insulating layer 10 but also insulating layers of the circuit layer DP_CL to be described below may be inorganic layers and/or organic layers and may have a single-layer structure or a multi-layer structure. The inorganic layers may include at least one of the aforementioned materials.

The third electrode G1 of the first transistor T1, the third electrode G2 of the second transistor T2, and the third electrode G3 of the third transistor T3 are disposed on the first insulating layer 10. The third electrode G1 of the first transistor T1 overlaps the channel part A1 of the first transistor T1, the third electrode G2 of the second transistor T2 overlaps the channel part A2 of the second transistor T2, and the third electrode G3 of the third transistor T3 overlaps the channel part A3 of the third transistor T3 in a plan view.

A first capacitor electrode C1-1 of the first capacitor C1 and a third capacitor electrode C2-1 of the second capacitor C2 are additionally disposed on the first insulating layer 10. The first capacitor electrode C1-1 may extend from the third electrode G1 of the first transistor T1 and may be integrally formed with the third electrode G1 of the first transistor T1. The third capacitor electrode C2-1 may be spaced apart from the first capacitor electrode C1-1. The third electrode G1 of the first transistor T1, the first capacitor electrode C1-1, and the third capacitor electrode C2-1 may be portions of a first gate pattern layer 120 illustrated in FIG. 5A. The first capacitor electrode C1-1 and the third capacitor electrode C2-1 may not overlap each other in the plan view (that is, may be spaced apart from each other).

A second insulating layer 20 that covers the third electrode G1 of the first transistor T1, the third electrode G2 of the second transistor T2, the third electrode G3 of the third transistor T3, the first capacitor electrode C1-1, and the third capacitor electrode C2-1 is disposed on the first insulating layer 10. The second insulating layer 20 commonly overlaps the plurality of pixels PX in a plan view. The second insulating layer 20 may be an inorganic layer and/or an organic layer and may have a single-layer structure or a multi-layer structure. In this embodiment, the second insulating layer 20 may be a single silicon oxide layer.

A second capacitor electrode C1-2 of the first capacitor C1 and a fourth capacitor electrode C2-2 of the second capacitor C2 may be disposed on the second insulating layer 20. The second capacitor electrode C1-2 faces the first capacitor electrode C1-1 with the second insulating layer 20 therebetween to form the first capacitor C1. The fourth capacitor electrode C2-2 faces the third capacitor electrode C2-1 with the second insulating layer 20 therebetween to form the second capacitor C2. The second capacitor electrode C1-2 and the fourth capacitor electrode C2-2 may be portions of a second gate pattern layer 130 illustrated in FIG. 5B. The second capacitor electrode C1-2 and the fourth capacitor electrode C2-2 may not overlap each other in the plan view (that is, may be spaced apart from each other).

A third insulating layer 30 that covers the second capacitor electrode C1-2 and the fourth capacitor electrode C2-2 is disposed on the second insulating layer 20. In this embodiment, the third insulating layer 30 may be a single silicon oxide layer.

A first bridge electrode BE1 and a second bridge electrode BE2 are disposed on the third insulating layer 30. The first bridge electrode BE1 may be an electrode that connects the third electrode G1 of the first transistor T1 (that is, the first capacitor electrode C1-1 of the first capacitor C1) and the second electrode D3 of the third transistor T3. The first bridge electrode BE1 is connected with the third electrode G1 of the first transistor T1 (that is, the first capacitor electrode C1-1 of the first capacitor C1) through a contact hole penetrating the second and third insulating layers 20 and 30. Furthermore, the first bridge electrode BE1 is connected with the second electrode D3 of the third transistor T3 through a contact hole penetrating the first to third insulating layers 10, 20, and 30. Even though not illustrated in FIG. 4, two second bridge electrodes BE2 shown in FIG. 4 are electrically connected to each other, and two fourth capacitor electrodes C2-2 shown in FIG. 4 are electrically connected to each other.

The second bridge electrode BE2 may be an electrode that connects the second capacitor electrode C1-2 and the third capacitor electrode C2-1 and connects the third capacitor electrode C2-1 and the second electrode D2 of the second transistor T2. The second bridge electrode BE2 is connected with the second capacitor electrode C1-2 through a contact hole penetrating the third insulating layer 30, and is connected with the third capacitor electrode C2-1 through a contact hole penetrating the second and third insulating layers 20 and 30. Furthermore, the second bridge electrode BE2 is connected with the third capacitor electrode C2-1 through a contact hole penetrating the second and third insulating layers 20 and 30, and is connected with the second electrode D2 of the second transistor T2 through a contact hole penetrating the first to third insulating layers 10, 20, and 30.

First and second connecting electrodes CE1 and CE2 are additionally disposed on the third insulating layer 30. The first connecting electrode CE1 is an electrode for connecting the fourth capacitor electrode C2-2 to the first drive voltage line VL1, and the second connecting electrode CE2 is an electrode for connecting the first electrode S2 of the second transistor T2 to a data line (that is, the i-th data line DLi).

The first connecting electrode CE1 is connected with the fourth capacitor electrode C2-2 through a contact hole penetrating the third insulating layer 30, and the second connecting electrode CE2 is connected with the first electrode S2 of the second transistor T2 through a contact hole penetrating the first to third insulating layers 10, 20, and 30.

Figure 5A:
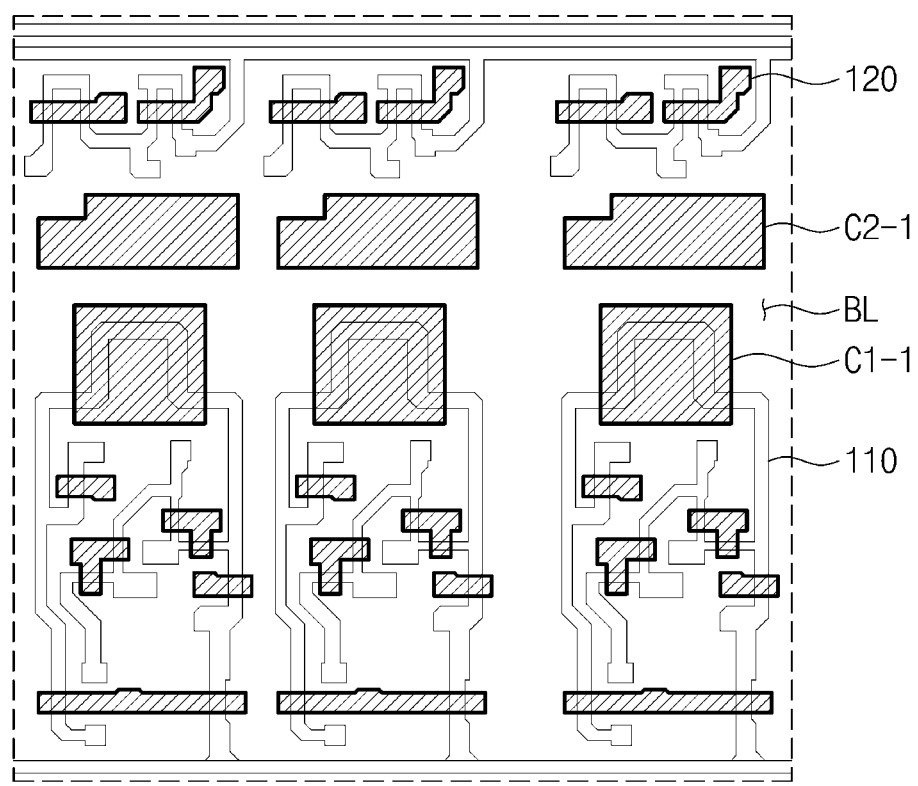
FIGS. 5A to 5F are plan views illustrating layouts of layers stacked in the display panel.
Figure 5B:
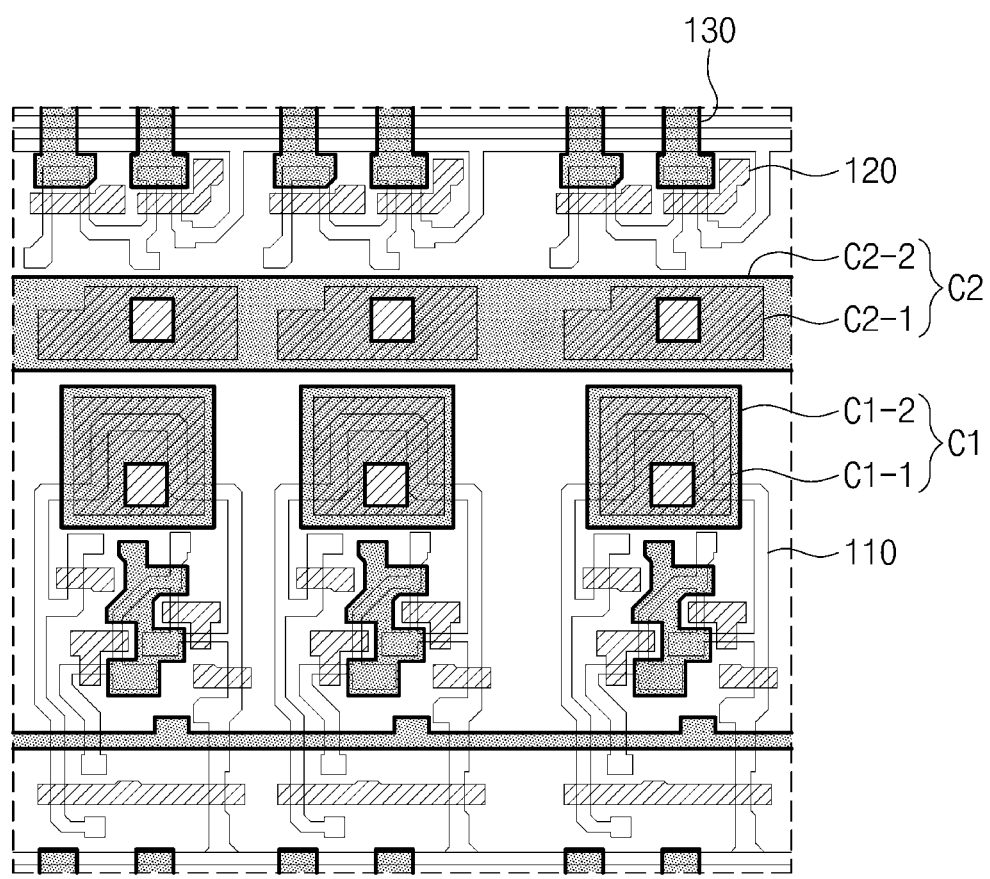
Figure 5C:
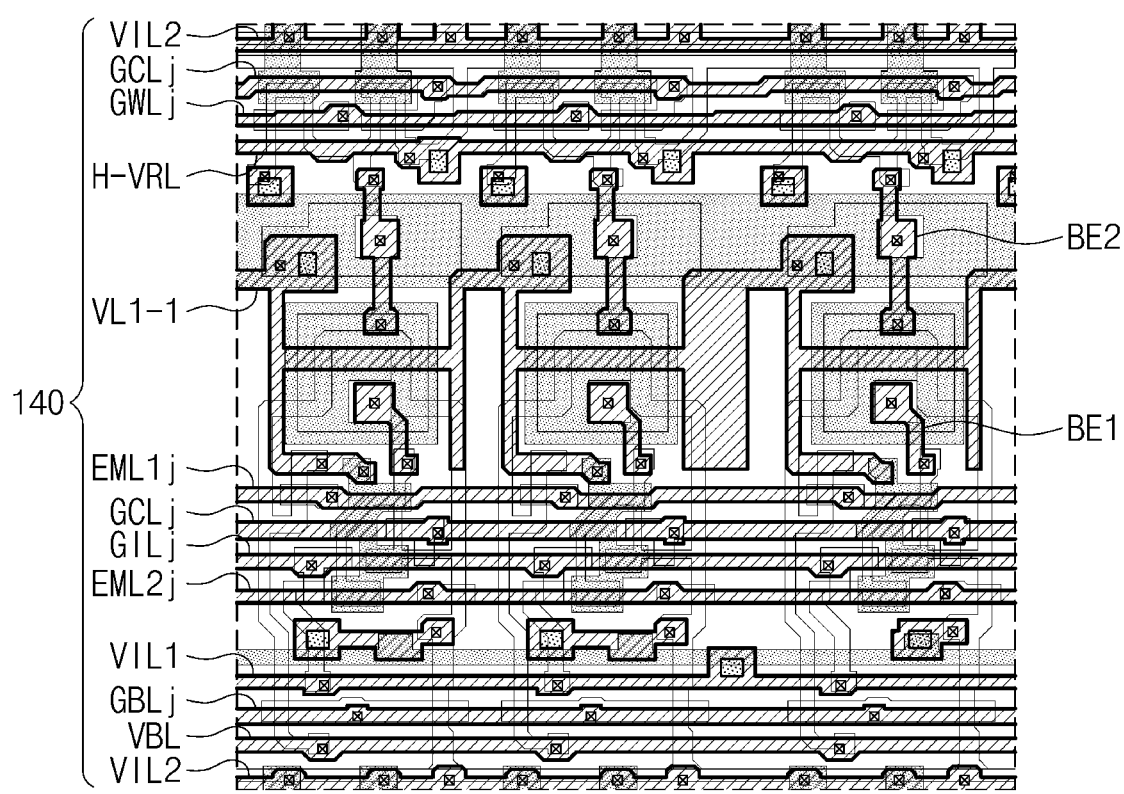

The first and second bridge electrodes BE1 and BE2 and the first and second connecting electrodes CE1 and CE2 may be portions of a first data pattern layer 140 illustrated in FIG. 5C.

A fourth insulating layer 40 is disposed to cover the first and second bridge electrodes BE1 and BE2 and the first and second connecting electrodes CE1 and CE2. The first drive voltage line VL1, the i-th data line DLi, and a shielding electrode SSE may be disposed on the fourth insulating layer 40. The shielding electrode SSE may be integrally formed (i.e., integrally provided) with the first drive voltage line VL1. The first drive voltage line VL1 and the shielding electrode SSE may be spaced apart from the i-th data line DLi.

The first drive voltage line VL1 is connected with the first connecting electrode CE1 through a contact hole formed through the fourth insulating layer 40, and the i-th data line DLi is connected with the second connecting electrode CE2 through a contact hole formed through the fourth insulating layer 40.

The shielding electrode SSE may be disposed over the first and second bridge electrodes BE1 and BE2 and may overlap the first and second bridge electrodes BE1 and BE2 in the plan view. In the present disclosure, the first bridge electrode BE1 may correspond to the first node N1 illustrated in FIG. 2A, and the second bridge electrode BE2 may correspond to the second node N2 illustrated in FIG. 2A. The first and second nodes N1 and N2 may have a floating state in the low level period (that is, the light emission period) of the second-(j-th) light emission control signal EM2j (refer to FIG. 2B). When the first and second nodes N1 and N2 are in the floating state, the potentials (i.e., voltages) of the first and second nodes N1 and N2 may be easily shaken by an ambient signal (e.g., a data signal applied to an adjacent data line (e.g., an (i+1)th data line)). However, as the first and second bridge electrodes BE1 and BE2 are covered by the shielding electrode SSE, the shielding electrode SSE may block an influence of the ambient signal on the first and second nodes N1 and N2.

Figure 5D:
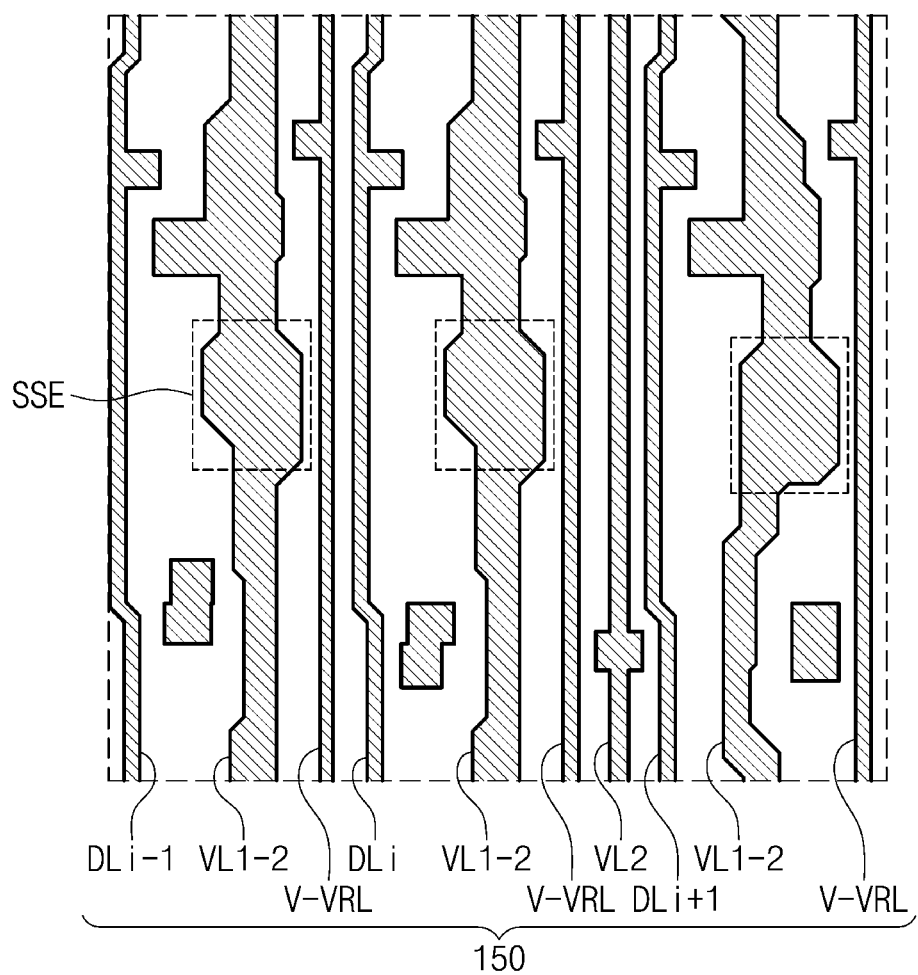

The first drive voltage line VL1, the i-th data line DLi, and the shielding electrode SSE may be portions of a second data pattern layer 150 illustrated in FIG. 5D.

A fifth insulating layer 50 that covers the first drive voltage line VL1, the i-th data line DLi, and the shielding electrode SSE is disposed on the fourth insulating layer 40. In this embodiment, the fifth insulating layer 50 may include a silicon oxide layer and a silicon nitride layer. The fifth insulating layer 50 may include a plurality of silicon oxide layers and a plurality of silicon nitride layers alternately stacked one above another.

The element layer DP_ED is disposed on the circuit layer DP_CL. The element layer DP_ED may include the light emitting element ED and a pixel defining layer PDL. The light emitting element ED includes the anode AE, an emissive layer EL, and the cathode CCE.

The pixel defining layer PDL may include an opening OP defined therein to correspond to the light emitting element ED. The opening OP exposes at least a portion of the anode AE of the light emitting element ED. The opening OP of the pixel defining layer PDL may define an emissive region PXA. In an embodiment, for example, the plurality of pixels PX (refer to FIG. 1) may be disposed in the plan view of the display panel DP (refer to FIG. 1) according to a predetermined rule. Regions where the plurality of pixels PX are disposed may be defined as pixel regions, and one pixel region may include an emissive region PXA and a non-emissive region NPXA adjacent to the emissive region PXA. The non-emissive region NPXA may surround the emissive region PXA.

The emissive layer EL is disposed to correspond to the opening OP defined in the pixel defining layer PDL. Although the patterned emissive layer EL is illustrated in this embodiment, the present disclosure is not limited thereto. A common emissive layer may be commonly disposed for the plurality of pixels PX in another embodiment. In this case, the common emissive layer may generate white light or blue light.

The cathode CCE is disposed on the emissive layer EL. The cathode CCE is commonly disposed for the plurality of pixels PX.

The display panel DP may further include an encapsulation layer that seals the element layer DP_ED. The encapsulation layer may include at least one organic layer and at least one inorganic layer. The inorganic layer may include an inorganic material and may protect the element layer DP_ED from moisture/oxygen. The inorganic layer may include a silicon nitride layer, a silicon oxy-nitride layer, a silicon oxide layer, a titanium oxide layer, or an aluminum oxide layer, but is not particularly limited thereto. The organic layer may include an organic material and may protect the element layer DP_ED from foreign matter such as dust particles.

Figure 5E:
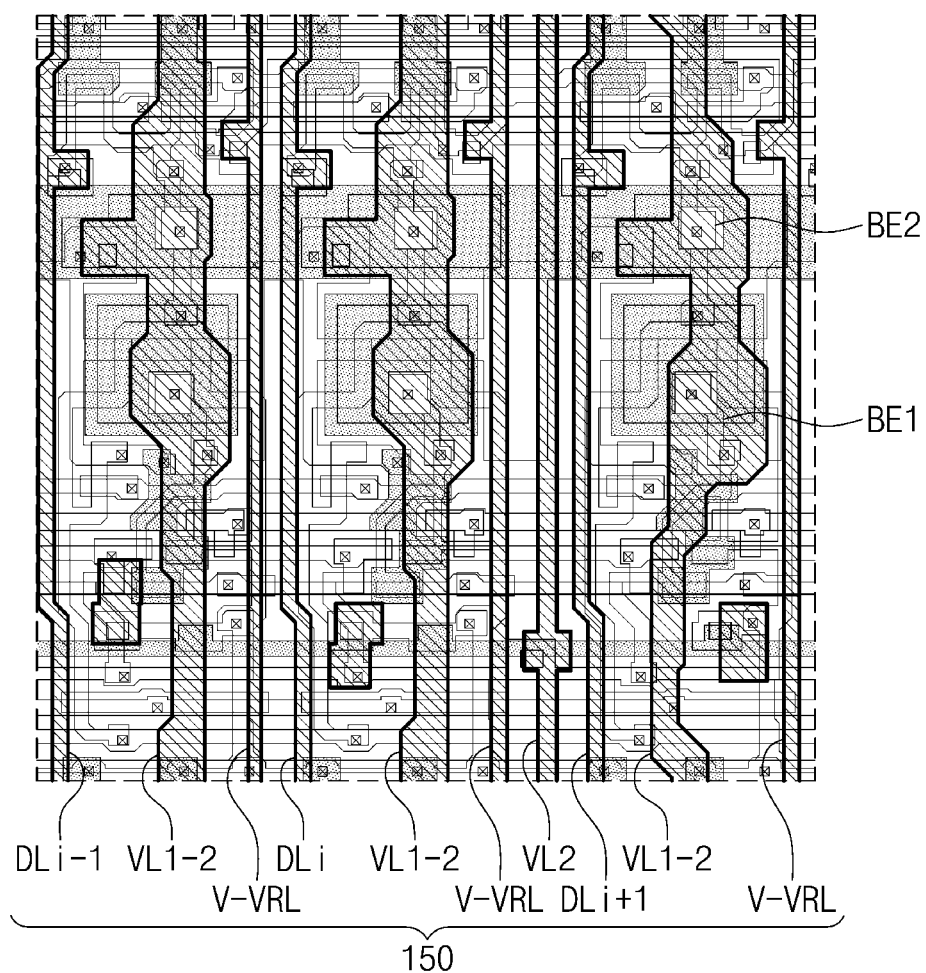
Figure 5F:
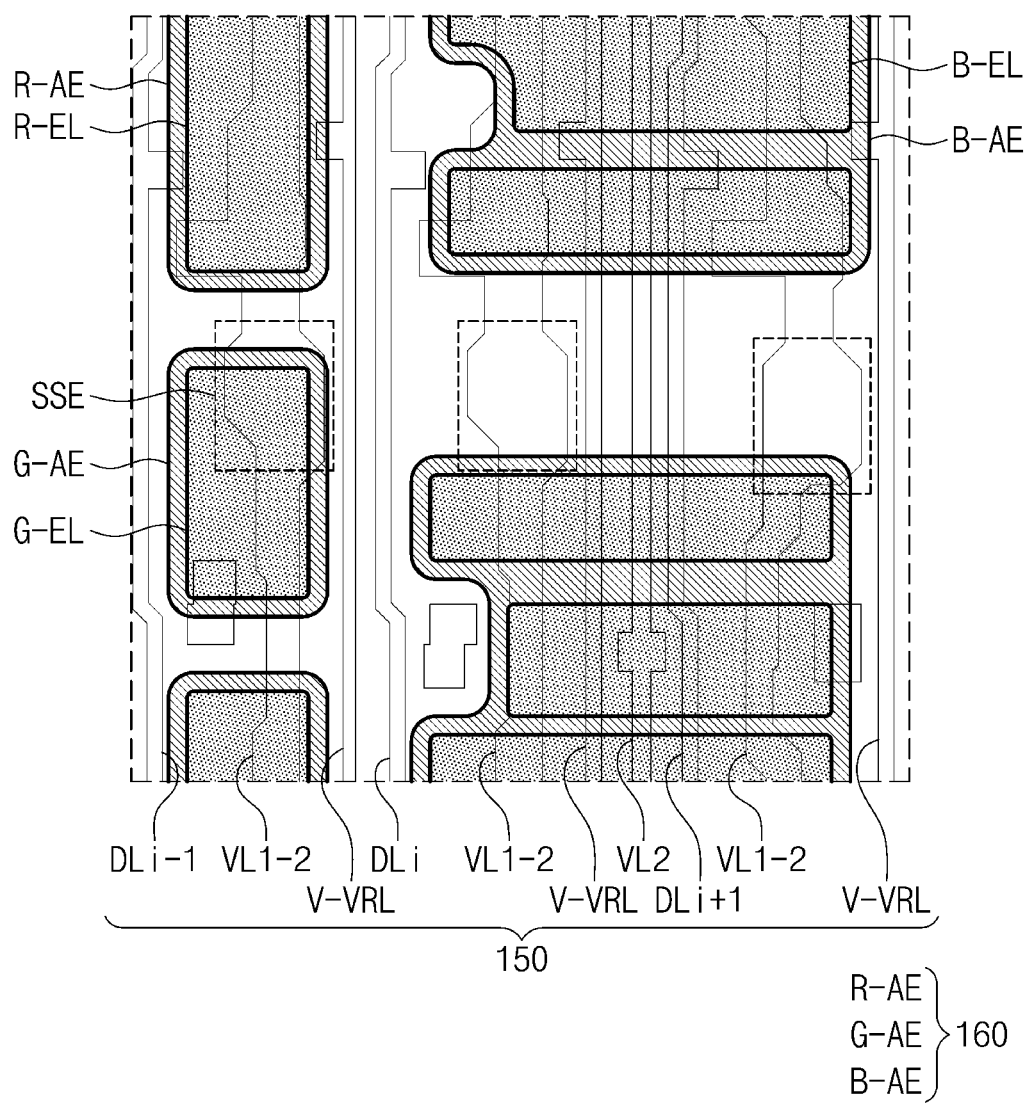

FIGS. 5A to 5F are plan views illustrating layouts of layers stacked in the display panel. Specifically, FIG. 5A is a plan view illustrating a semiconductor pattern layer and the first gate pattern layer disposed on the base layer, and FIG. 5B is a plan view illustrating the second gate pattern layer disposed on the first gate pattern layer. FIG. 5C is a plan view illustrating the first data pattern layer disposed on the second gate pattern layer. FIGS. 5D and 5E are plan views illustrating the second data pattern layer disposed on the first data pattern layer. FIG. 5F is a plan view illustrating an anode electrode layer disposed on the second data pattern layer. As used herein, the "plan view" is a view in a thickness direction (i.e., direction perpendicular to the first and second directions DR1 and DR2) of the base layer BL.

Referring to FIG. 5A, semiconductor patterns and conductive patterns may be repeatedly arranged on the base layer according to a predetermined rule. Plan views of three pixel circuit units PXC (refer to FIG. 2A) are illustrated in FIGS. 5A to 5E.

Referring to FIGS. 4 and 5A, a semiconductor pattern layer 110 is illustrated. The semiconductor pattern layer 110 may be disposed on the base layer BL. The semiconductor pattern layer 110 may include a silicon semiconductor. In an embodiment, for example, the silicon semiconductor may include amorphous silicon or polycrystalline silicon. In an embodiment, for example, the semiconductor pattern layer 110 may include low-temperature polycrystalline silicon (LTPS).

The semiconductor pattern layer 110 includes semiconductor patterns of transistors (that is, the first to ninth transistors T1 to T9 (refer to FIG. 2A)) included in each pixel circuit unit PXC.

The first insulating layer 10 may be disposed on the semiconductor pattern layer 110, and the first gate pattern layer 120 may be disposed on the first insulating layer 10. The first gate pattern layer 120 may be a layer formed by making a first gate metal layer subject to patterning. The first gate pattern layer 120 may include metal, alloy, conductive metal oxide, or a transparent conductive material. In an embodiment, for example, the first gate pattern layer 120 may include silver (Ag), an alloy containing silver, molybdenum (Mo), an alloy containing molybdenum, aluminum (Al), an alloy containing aluminum, aluminum nitride ("AlN"), tungsten (W), tungsten nitride ("WN"), copper (Cu), indium tin oxide ("ITO"), or indium zinc oxide ("IZO"), but is not particularly limited thereto.

The first gate pattern layer 120 may include the third electrodes of the transistors (that is, the first to ninth transistors T1 to T9) included in each pixel circuit unit PXC. The first to ninth transistors T1 to T9 may be disposed in each pixel circuit unit PXC by the first gate pattern layer 120 and the semiconductor pattern layer 110.

The first gate pattern layer 120 may further include the first capacitor electrode C1-1 of the first capacitor C1 and the third capacitor electrode C2-1 of the second capacitor C2 that are included in each pixel circuit unit PXC.

Referring to FIGS. 4 and 5B, the second insulating layer 20 may be disposed on the first insulating layer 10 to cover the first gate pattern layer 120. The second gate pattern layer 130 may be disposed on the second insulating layer 20. The second gate pattern layer 130 may be a layer formed by making a second gate metal layer subject to patterning. The second gate pattern layer 130 may include metal, alloy, conductive metal oxide, or a transparent conductive material.

The second gate pattern layer 130 may include the second capacitor electrode C1-2 of the first capacitor C1 and the fourth capacitor electrode C2-2 of the second capacitor C2. The first and second capacitors C1 and C2 may be disposed in each pixel circuit unit PXC by the first gate pattern layer 120 and the second gate pattern layer 130.

Referring to FIGS. 4 and 5C, the third insulating layer 30 may be disposed on the second insulating layer 20 to cover the second gate pattern layer 130. The first data pattern layer 140 may be disposed on the third insulating layer 30. The first data pattern layer 140 may be a layer formed by making a first data metal layer subject to patterning. The first data pattern layer 140 may include metal, alloy, conductive metal oxide, or a transparent conductive material.

The first data pattern layer 140 may include the scan lines GWLj, GCLj, GILj, and GBLj illustrated in FIG. 2A, the light emission control lines EML1j and EML2j, a horizontal reference voltage line H-VRL, the first and second initialization voltage lines VIL1 and VIL2, the bias voltage line VBL, and a first horizontal voltage line VL1-1. The first data pattern layer 140 may further include the first and second bridge electrodes BE1 and BE2 and the first and second connecting electrodes CE1 and CE2 illustrated in FIG. 4.

The first bridge electrode BE1 may be an electrode that connects the third electrode G1 of the first transistor T1 (that is, the first capacitor electrode C1-1 of the first capacitor C1) and the second electrode D3 of the third transistor T3. The first bridge electrode BE1 is connected with the third electrode G1 of the first transistor T1 (that is, the first capacitor electrode C1-1 of the first capacitor C1) through the contact hole penetrating the second and third insulating layers 20 and 30. Furthermore, the first bridge electrode BE1 is connected with the second electrode D3 of the third transistor T3 through the contact hole penetrating the first to third insulating layers 10, 20, and 30.

The second bridge electrode BE2 may be an electrode that connects the second capacitor electrode C1-2 of the first capacitor C1 and the third capacitor electrode C2-1 of the second capacitor C2 and connects the third capacitor electrode C2-1 of the second capacitor C2 and the second electrode D2 of the second transistor T2. The second bridge electrode BE2 is connected with the second capacitor electrode C1-2 of the first capacitor C1 through the contact hole penetrating the third insulating layer 30 and is connected with the third capacitor electrode C2-1 of the second capacitor C2 through the contact hole penetrating the second and third insulating layers 20 and 30. Furthermore, the second bridge electrode BE2 is connected with the third capacitor electrode C2-1 of the second capacitor C2 through the contact hole penetrating the second and third insulating layers 20 and 30 and is connected with the second electrode D2 of the second transistor T2 through the contact hole penetrating the first to third insulating layers 10, 20, and 30.

Referring to FIGS. 4, 5D, and 5E, the fourth insulating layer 40 may be disposed on the third insulating layer 30 to cover the first data pattern layer 140. The second data pattern layer 150 may be disposed on the fourth insulating layer 40. The second data pattern layer 150 may be a layer formed by making a second data metal layer subject to patterning. The second data pattern layer 150 may include, for example, metal, alloy, conductive metal oxide, or a transparent conductive material.

The second data pattern layer 150 may include data lines DLi−1, DLi and DLi+1, a first vertical voltage line VL1-2, a vertical reference voltage line V-VRL, and the second drive voltage line VL2.

The second data pattern layer 150 may further include the shielding electrode SSE extending from the first vertical voltage line VL1-2. The shielding electrode SSE may extend from the first vertical voltage line VL1-2 and may be integrally formed with the first vertical voltage line VL1-2. The shielding electrode SSE may extend from the first vertical voltage line VL1-2 to overlap the first and second bridge electrodes BE1 and BE2 of the first data pattern layer 140 in a plan view.

As the first and second bridge electrodes BE1 and BE2 are covered by the shielding electrode SSE, the shielding electrode SSE may block an influence of an ambient signal on the first and second nodes N1 and N2.

Referring to FIGS. 4 and 5F, the fifth insulating layer 50 may be disposed on the fourth insulating layer 40 to cover the second data pattern layer 150. The anode electrode layer 160 may be disposed on the fifth insulating layer 50. The anode electrode layer 160 may include, for example, metal, alloy, conductive metal oxide, or a transparent conductive material.

The anode electrode layer 160 may include a first anode R-AE of a first light emitting element, a second anode G-AE of a second light emitting element, and a third anode B-AE of a third light emitting element. The first light emitting element outputs first color light (e.g., red light), the second light emitting element outputs second color light (e.g., green light), and the third light emitting element outputs third color light (e.g., blue light). The light emitting element ED illustrated in FIG. 2A may be one of the first to third light emitting elements. Each of the first to third anodes R-AE, G-AE, and B-AE may be connected to a corresponding pixel circuit unit PXC (illustrated in FIG. 2A) through a contact hole.

The first light emitting element further includes a first emissive layer R-EL disposed on the first anode R-AE, the second light emitting element further includes a second emissive layer G-EL disposed on the second anode G-AE, and the third light emitting element further includes a third emissive layer B-EL disposed on the third anode B-AE.

Figure 5G:
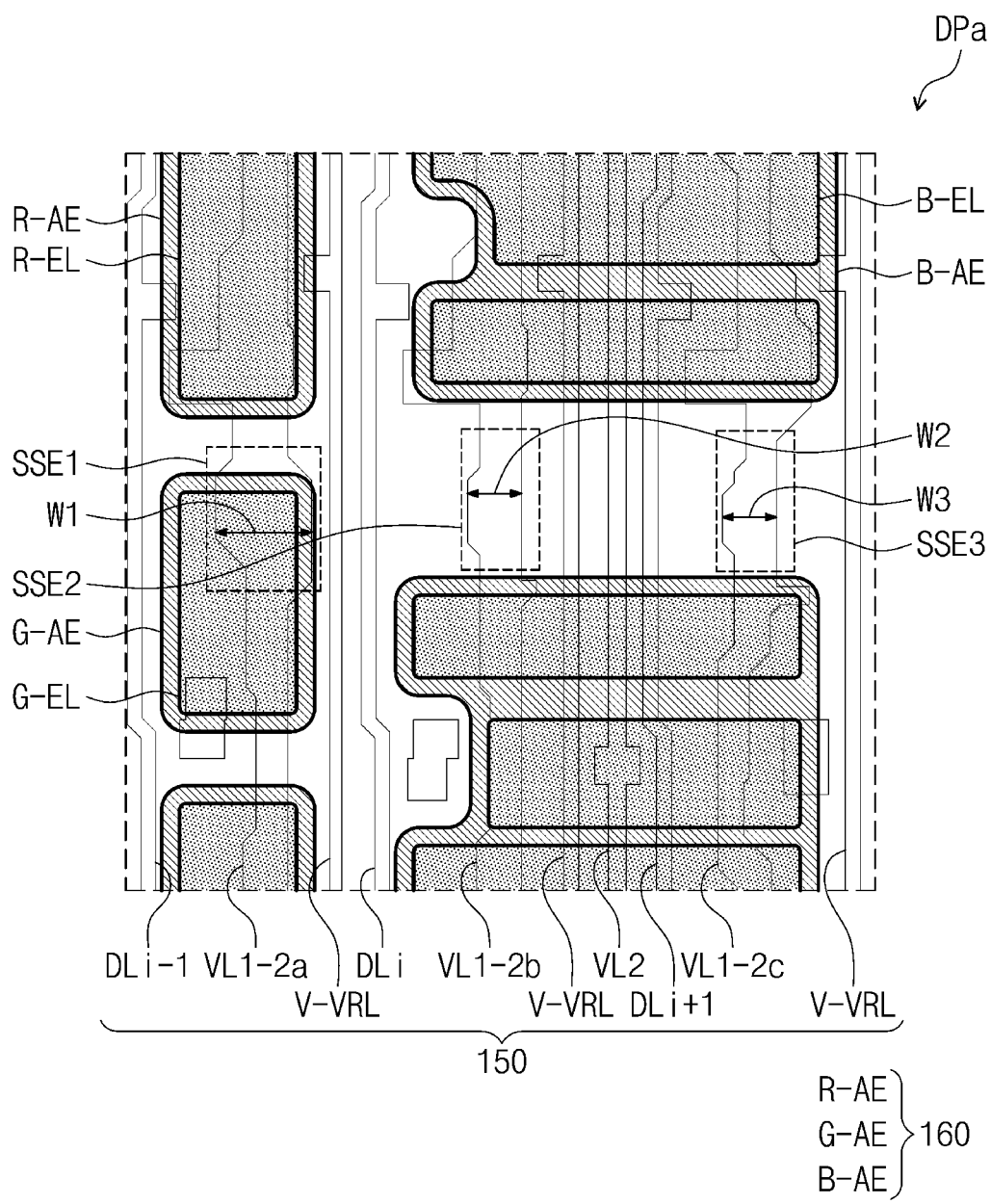
FIG. 5G is a plan view of a display panel according to an embodiment of the present disclosure.

FIG. 5G is a plan view of a display panel according to an embodiment of the present disclosure.

Referring to FIG. 5G, the display panel DPa according to an embodiment of the present disclosure may include a first shielding electrode SSE1, a second shielding electrode SSE2, and a third shielding electrode SSE3. The first shielding electrode SSE1 may have the same shape as the shielding electrode SSE illustrated in FIGS. 5E and 5F.

The display panel DPa may further include a first-first vertical voltage line VL1-2a, a first-second vertical voltage line VL1-2b, and a first-third vertical voltage line VL1-2c. The first-first to first-third vertical voltage lines VL1-2a, VL1-2b, and VL1-2c may be parallel to each other and may be spaced apart from each other by a predetermined gap.

The first shielding electrode SSE1 may be integrally formed with the first-first vertical voltage line VL1-2a and may overlap at least one of first to third emissive layers R-EL, G-EL, and B-EL (e.g., the second emissive layer G-EL) in the plan view. The first shielding electrode SSE1 may overlap, in the plan view, at least one of the emissive regions PXA illustrated in FIG. 4. The second shielding electrode SSE2 may be integrally formed with the first-second vertical voltage line VL1-2b and may not overlap the first to third emissive layers R-EL, G-EL, and B-EL in the plan view. The third shielding electrode SSE3 may be integrally formed with the first-third vertical voltage line VL1-2c and may not overlap the first to third emissive layers R-EL, G-EL, and B-EL in the plan view. The second and third shielding electrodes SSE2 and SSE3 may overlap, in the plan view, the non-emissive region NPXA illustrated in FIG. 4.

The first shielding electrode SSE1 may have a width W1 greater than each of a width W2 of the second shielding electrode SSE2 and a width W3 of the third shielding electrode SSE3 in the plan view. The width W2 of the second shielding electrode SSE2 and the width W3 of the third shielding electrode SSE3 may be equal to each other, or may differ from each other.

When the width W2 of the second shielding electrode SSE2 and the width W3 of the third shielding electrode SSE3 each are less than the width W1 of the first shielding electrode SSE1, shielding performance may be decreased. However, light transmittance in the non-emissive region NPXA may be increased.

In a case in which an optical sensor is disposed on a rear surface of the display panel DPa of the display device DD (refer to FIG. 1) to sense light, light transmittance may be lowered when the widths of the shielding electrodes SSE1, SSE2, and SSE3 are increased. When the light transmittance is lowered, the sensing sensitivity of the optical sensor may be decreased. Therefore, in an embodiment of the present disclosure, each of the widths W2 and W3 of the second and third shielding electrodes SSE2 and SSE3 located in the non-emissive region NPXA may be adjusted to be less than the width W1 of the first shielding electrode SSE1 located in the emissive region PXA.

Figure 6:
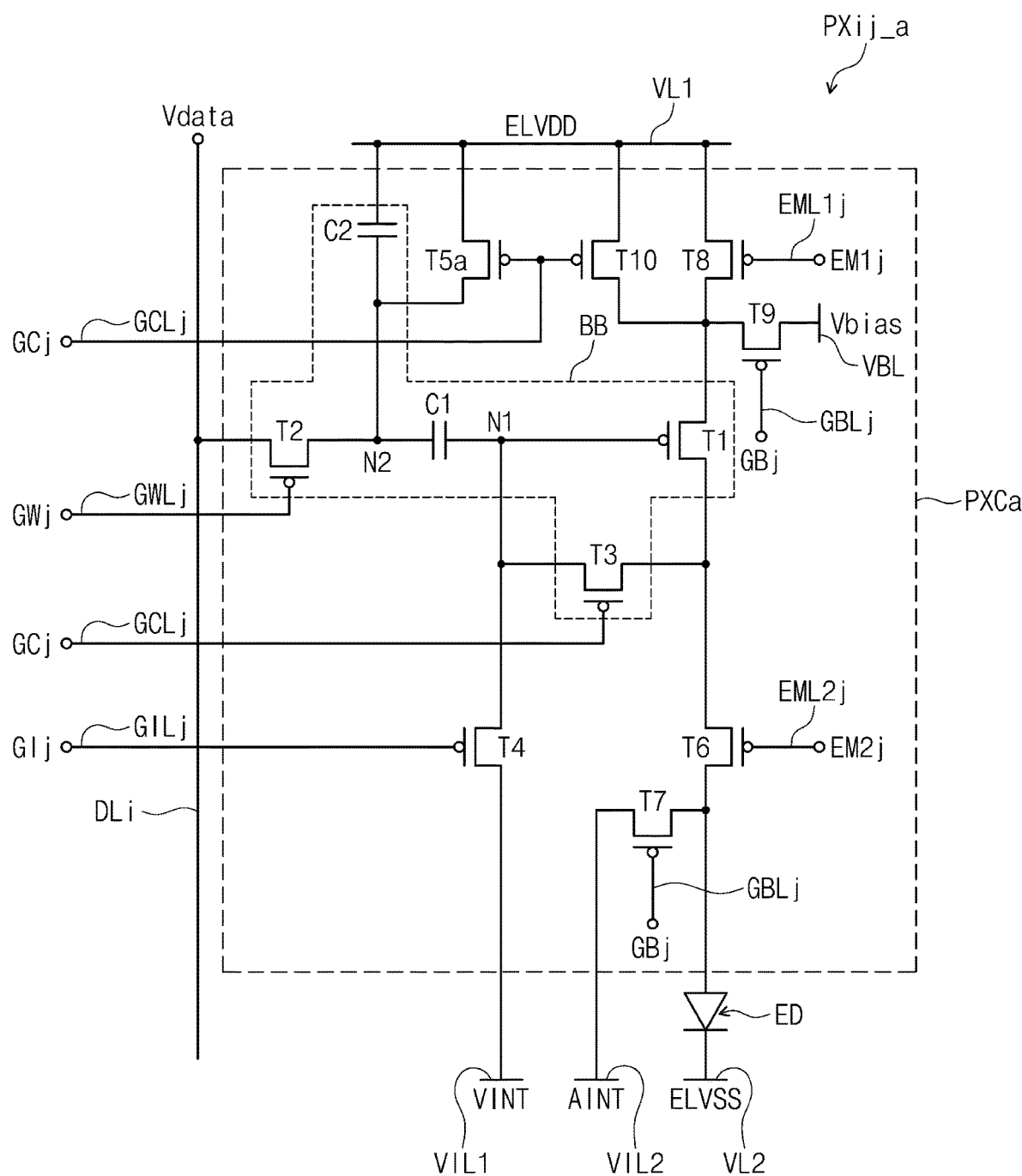
FIG. 6 is a circuit diagram of a pixel according to another embodiment of the present disclosure.

FIG. 6 is a circuit diagram of a pixel according to another embodiment of the present disclosure.

Referring to FIG. 6, the pixel PXij_a is connected to the j-th initialization scan line GILj among the initialization scan lines GIL1 to GILn, the j-th compensation scan line among the compensation scan lines GCL1 to GCLn, the j-th write scan line among the write scan lines GWL1 to GWLn, and the j-th black scan line among the black scan lines GBL1 to GBLn illustrated in FIG. 1. In addition, the pixel PXij_a is connected to the i-th data line DLi among the data lines DL1 to DLm illustrated in FIG. 1. The pixel PXij_a is connected to the first-(j-th) light emission control line EML1j among the first light emission control lines EML11 to EML1n and connected to the second-(j-th) light emission control line EML2j among the second light emission control lines EML21 to EML2n.

Referring to FIG. 6, the pixel PXij_a according to an embodiment includes a pixel circuit unit PXCa and a light emitting element ED. In an embodiment of the present disclosure, the pixel circuit unit PXCa may include ten transistors and two capacitors. Hereinafter, the ten transistors are referred to as the first to tenth transistors T1, T2, T3, T4, T5a, T6, T7, T8, T9, and T10, and the two capacitors are referred to as the first and second capacitors C1 and C2.

In this embodiment, each of the first to tenth transistors T1 to T10 is a P-type transistor having a low-temperature polycrystalline silicon (LTPS) semiconductor layer. Alternatively, each of the first to tenth transistors T1 to T10 may be an N-type transistor. In another case, at least one of the first to tenth transistors T1 to T10 may be an N-type transistor, and the remaining transistors may be P-type transistors. At least one of the first to tenth transistors T1 to T10 may be a transistor having an oxide semiconductor layer. In an embodiment, for example, some of the first to tenth transistors T1 to T10 may be oxide semiconductor transistors, and the remaining transistors may be LTPS transistors.

A circuit configuration of the pixel PXij_a according to the present disclosure is almost the same as the circuit configuration of the pixel PXij illustrated in FIG. 2A, and therefore repetitive descriptions will be omitted.

The pixel PXij_a may be connected to a first drive voltage line VL1, a second drive voltage line VL2, a first initialization voltage line VIL1, a second initialization voltage line VIL2, and a bias voltage line VBL. That is, the pixel PXij_a illustrated in FIG. 6 is connected to the five voltage lines VL1, VL2, VIL1, VIL2, and VBL, and the pixel PXij illustrated in FIG. 2A is connected to the sixth voltage lines VL1, VL2, VIL1, VIL2, VRL, and VBL. When the number of voltage lines connected to the pixel PXij_a is decreased, a space in which the elements of the pixel circuit unit PXCa are disposed may be further secured, and the overall light transmittance of the display panel may be increased.

The fifth transistor T5a may be electrically connected between a second node N2 and the first drive voltage line VL1. The fifth transistor T5a includes a first electrode connected to the first drive voltage line VL1, a second electrode electrically connected to the second node N2, and a third electrode that receives the j-th compensation scan signal GCj through the j-th compensation scan line GCLj. During the compensation periods AP4, AP5, and AP6 (refer to FIG. 2B), the fifth transistor T5a is turned on in response to the j-th compensation scan signal GCj provided to the j-th compensation scan line GCLj. The first drive voltage line VL1 and the second node N2 are electrically connected by the turned-on fifth transistor T5a. That is, during the compensation periods AP4, AP5, and AP6, the first drive voltage ELVDD may be applied to the second node N2.

The tenth transistor T10 may be electrically connected between the first transistor T1 and the first drive voltage line VL1. Specifically, the tenth transistor T10 includes a first electrode electrically connected to the first drive voltage line VL1, a second electrode electrically connected to a first electrode of the first transistor T1, and a third electrode that receives the j-th compensation scan signal GCj through the j-th compensation scan line GCLj. During the compensation periods AP4, AP5, and AP6, the tenth transistor T10 is turned on in response to the j-th compensation scan signal GCj provided to the j-th compensation scan line GCLj. The first drive voltage line VL1 and the first electrode of the first transistor T1 are electrically connected by the turned-on tenth transistor T10. That is, during the compensation periods AP4, AP5, and AP6, the first drive voltage ELVDD may be applied to the first electrode of the first transistor T1.

In an embodiment of the present disclosure, the second initialization voltage line VIL2 may include a second-first initialization voltage line VIL2-G (refer to FIG. 8D) connected to at least one of a first pixel outputting first color light (e.g., red light), a second pixel outputting second color light (e.g., green light), and a third pixel outputting third color light (e.g., blue light) among the pixels PX (refer to FIG. 1) and a second-second initialization voltage line VIL2-RB (refer to FIG. 8D) connected to the remaining pixels. In an embodiment, for example, the second-first initialization voltage line VIL2-G may be connected to the second pixel and may apply a second-first initialization voltage to the second pixel, and the second-second initialization voltage line VIL2-RB may be connected to the first and third pixels and may apply a second-second initialization voltage to the first and third pixels. The second-first initialization voltage may have a voltage level different from a voltage level of the second-second initialization voltage. As the voltage levels of the second initialization voltages for the respective pixels differ from each other as described above, a luminance difference between the pixels may be effectively improved.

Figure 7:
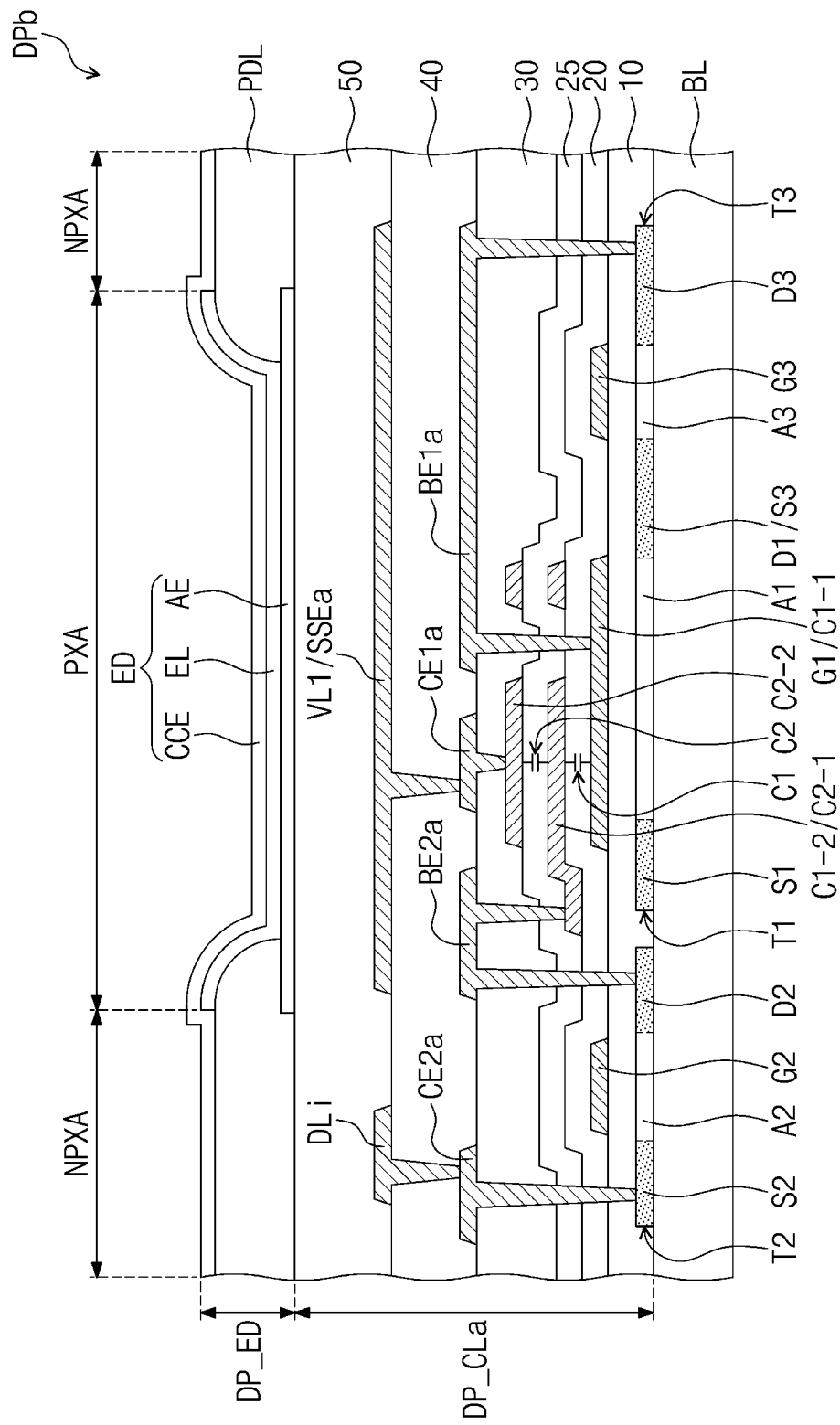
FIG. 7 is a cross-sectional view of a display panel according to another embodiment of the present disclosure.

FIG. 7 is a cross-sectional view of a display panel according to another embodiment of the present disclosure. In particular, FIG. 7 illustrates a sectional structure of portion BB of the pixel PXij_a illustrated in FIG. 6. Among components illustrated in FIG. 7, components identical to the components illustrated in FIG. 4 will be assigned with identical reference numerals, and specific descriptions thereabout will be omitted.

Referring to FIG. 7, the display panel DPb may include a base layer BL, a circuit layer DP_CLa, and an element layer DP_ED.

The circuit layer DP_CLa is disposed on the base layer BL. The circuit layer DP_CLa includes first, second, and third semiconductor patterns disposed on the base layer BL. The first to third semiconductor patterns may include poly silicon. However, without being limited thereto, the first to third semiconductor patterns may include amorphous silicon or an oxide semiconductor in another embodiment.

As illustrated in FIG. 7, a first electrode S1, a channel part A1, and a second electrode D1 of the first transistor T1 are formed from the first semiconductor pattern, a first electrode S2, a channel part A2, and a second electrode D2 of the second transistor T2 are formed from the second semiconductor pattern, and a first electrode S3, a channel part A3, and a second electrode D3 of the third transistor T3 are formed from the third semiconductor pattern. The first electrode S3 of the third transistor T3 may be connected and integrally formed (i.e., integrally provided) with the second electrode D1 of the first transistor T1.

A first insulating layer 10 (or, a gate insulating layer) is disposed on the base layer BL. The first insulating layer 10 commonly overlaps the plurality of pixels PX and covers the first to third semiconductor patterns in a plan view.

A third electrode G1 of the first transistor T1, a third electrode G2 of the second transistor T2, and a third electrode G3 of the third transistor T3 are disposed on the first insulating layer 10. The third electrode G1 of the first transistor T1 overlaps the channel part A1 of the first transistor T1, the third electrode G2 of the second transistor T2 overlaps the channel part A2 of the second transistor T2, and the third electrode G3 of the third transistor T3 overlaps the channel part A3 of the third transistor T3 in a plan view.

A first capacitor electrode C1-1 of the first capacitor C1 is additionally disposed on the first insulating layer 10. The first capacitor electrode C1-1 of the first capacitor C1 may extend from the third electrode G1 of the first transistor T1 and may be integrally formed with the third electrode G1 of the first transistor T1.

Figure 8A:
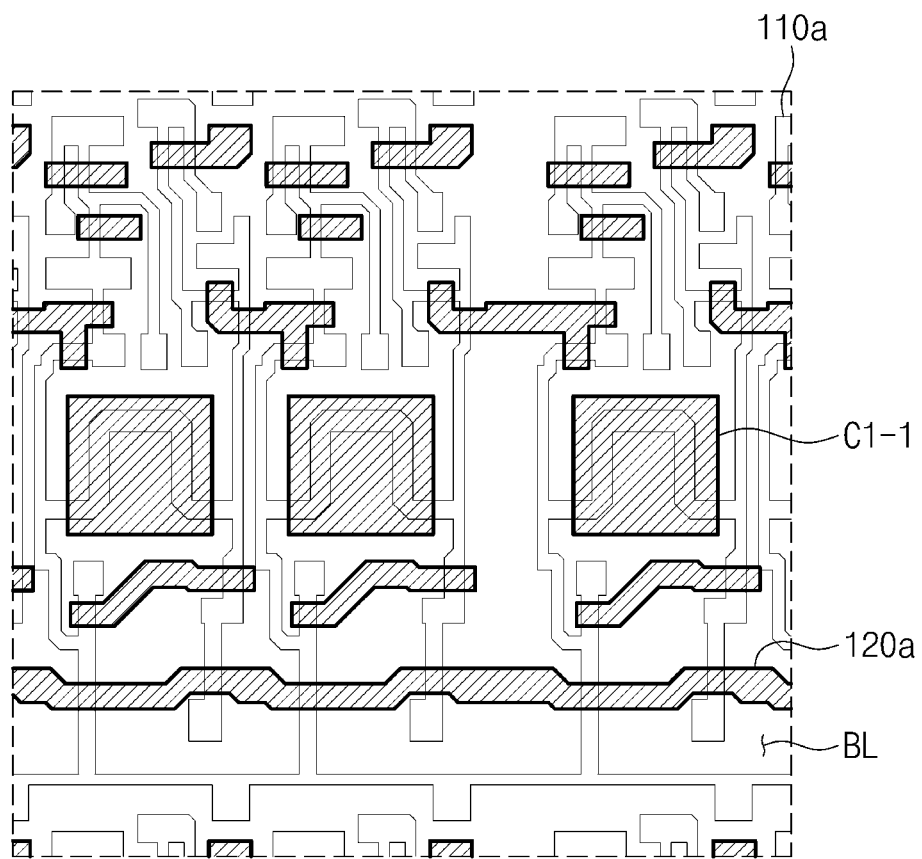
FIGS. 8A to 8G are plan views illustrating layouts of layers stacked in the display panel.

The third electrode G1 of the first transistor T1, the third electrode G2 of the second transistor T2, the third electrode G3 of the third transistor T3, and the first capacitor electrode C1-1 of the first capacitor C1 may be portions of a first gate pattern layer 120a of FIG. 8A.

A second insulating layer 20 that covers the third electrode G1 of the first transistor T1, the third electrode G2 of the second transistor T2, the third electrode G3 of the third transistor T3, and the first capacitor electrode C1-1 of the first capacitor C1 is disposed on the first insulating layer 10.

A second capacitor electrode C1-2 of the first capacitor C1 and a third capacitor electrode C2-1 of the second capacitor C2 may be disposed on the second insulating layer 20. The second capacitor electrode C1-2 of the first capacitor C1 and the third capacitor electrode C2-1 of the second capacitor C2 may be integrally formed with each other.

The second capacitor electrode C1-2 of the first capacitor C1 faces the first capacitor electrode C1-1 of the first capacitor C1 with the second insulating layer 20 therebetween to form the first capacitor C1. The second capacitor electrode C1-2 of the first capacitor C1 and the third capacitor electrode C2-1 of the second capacitor C2 may be portions of a second gate pattern layer 130a of FIG. 8B. In an embodiment of the present disclosure, the third capacitor electrode C2-1 of the second capacitor C2 may overlap the first capacitor electrode C1-1 of the first capacitor C1 in the plan view.

An additional insulating layer 25 that covers the second capacitor electrode C1-2 of the first capacitor C1 is disposed on the second insulating layer 20. In this embodiment, the additional insulating layer 25 may be a single silicon oxide layer.

A fourth capacitor electrode C2-2 of the second capacitor C2 may be disposed on the additional insulating layer 25. The fourth capacitor electrode C2-2 of the second capacitor C2 faces the third capacitor electrode C2-1 of the second capacitor C2 with the additional insulating layer 25 therebetween to form the second capacitor C2. The fourth capacitor electrode C2-2 of the second capacitor C2 may be a portion of an additional pattern layer 135a illustrated in FIG. 8C. In an embodiment of the present disclosure, the fourth capacitor electrode C2-2 of the second capacitor C2 may overlap the second capacitor electrode C1-2 of the first capacitor C1 in the plan view.

A first bridge electrode BE1a and a second bridge electrode BE2a are disposed on a third insulating layer 30. The first bridge electrode BE1a may be an electrode that connects the first capacitor electrode C1-1 of the first capacitor C1 and the second electrode D2 of the third transistor T3, and the second bridge electrode BE2a may be an electrode that connects the second capacitor electrode C1-2 of the first capacitor C1 and the second electrode D2 of the second transistor T2. The first bridge electrode BE1a is connected with the first capacitor electrode C1-1 of the first capacitor C1 through a contact hole penetrating the second insulating layer 20, the additional insulating layer 25, and the third insulating layer 30 and is connected with the second electrode D2 of the third transistor T3 through a contact hole penetrating the first insulating layer 10, the second insulating layer 20, the additional insulating layer 25, and the third insulating layer 30. The second bridge electrode BE2a is connected with the second capacitor electrode C1-2 of the first capacitor C1 through a contact hole penetrating the additional insulating layer 25 and the third insulating layer 30 and is connected with the second electrode D2 of the second transistor T2 through a contact hole penetrating the first insulating layer 10, the second insulating layer 20, the additional insulating layer 25, and the third insulating layer 30.

First and second connecting electrodes CE1a and CE2a are additionally disposed on the third insulating layer 30. The first connecting electrode CE1a is an electrode for connecting the fourth capacitor electrode C2-2 of the second capacitor C2 to the first drive voltage line VL1, and the second connecting electrode CE2a is an electrode for connecting the first electrode S2 of the second transistor T2 to a data line (that is, the i-th data line DLi).

The first connecting electrode CE1a is connected with the fourth capacitor electrode C2-2 of the second capacitor C2 through a contact hole penetrating the third insulating layer 30, and the second connecting electrode CE2a is connected with the first electrode S2 of the second transistor T2 through a contact hole penetrating the first insulating layer 10, the second insulating layer 20, the additional insulating layer 25, and the third insulating layer 30.

Figure 8B:
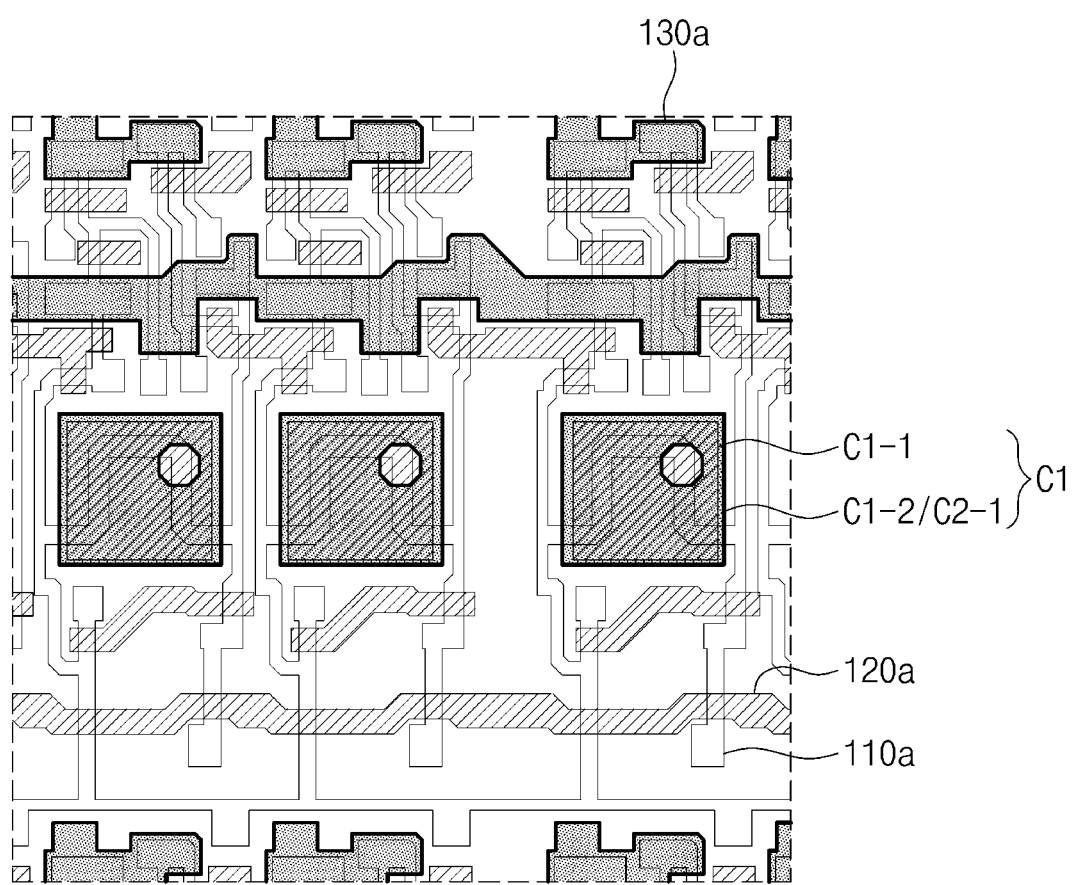
Figure 8C:
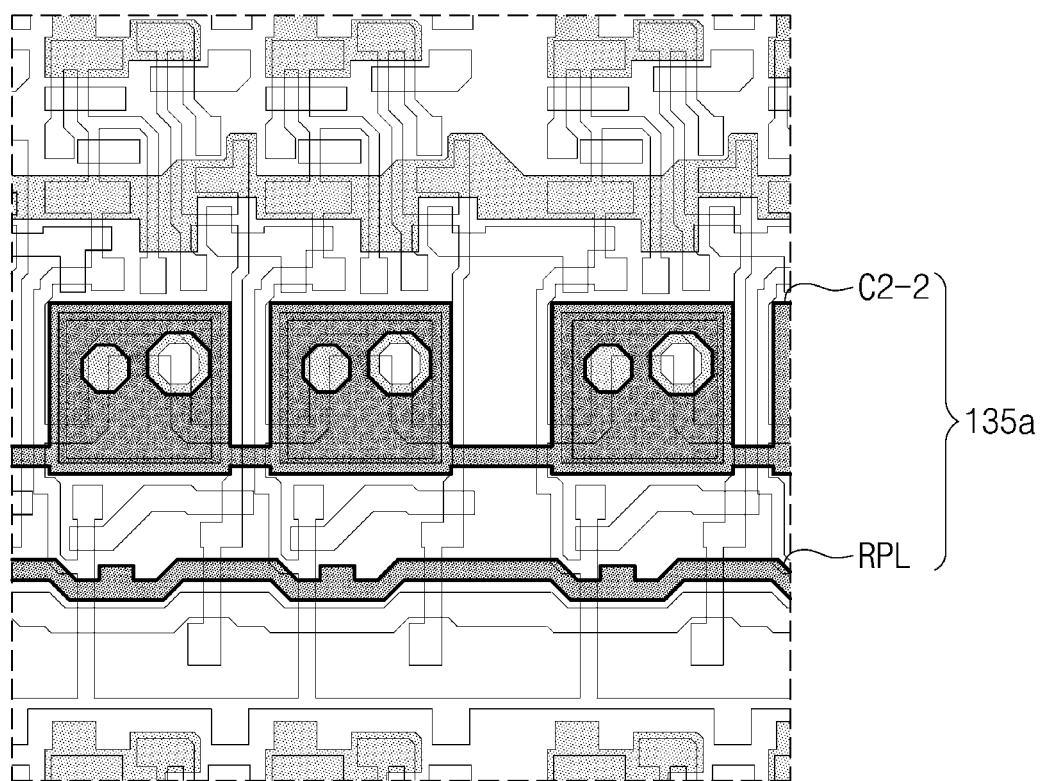
Figure 8D:
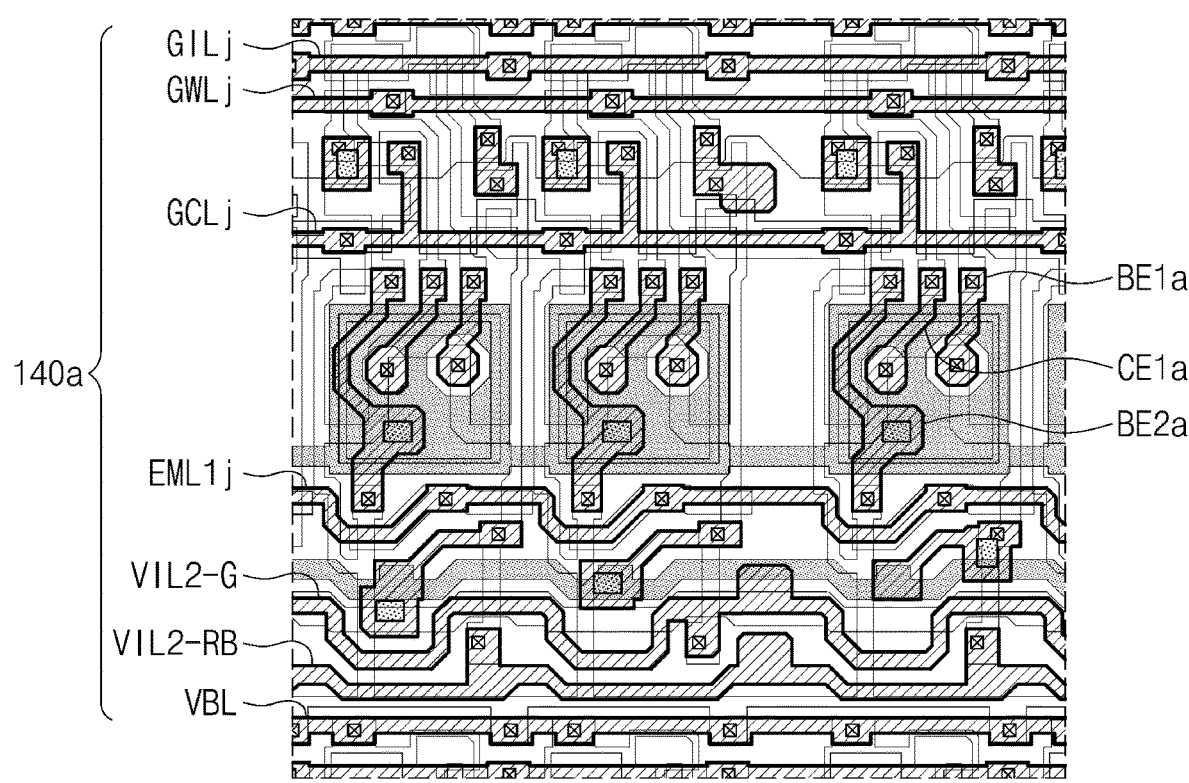

The first and second bridge electrodes BE1a and BE2a and the first and second connecting electrodes CE1a and CE2a may be portions of a first data pattern layer 140a illustrated in FIG. 8D.

A fourth insulating layer 40 is disposed to cover the first and second bridge electrodes BE1a and BE2a and the first and second connecting electrodes CE1a and CE2a. The first drive voltage line VL1, the i-th data line DLi, and a shielding electrode SSEa may be disposed on the fourth insulating layer 40. The shielding electrode SSEa may be integrally formed with the first drive voltage line VL1. The first drive voltage line VL1 and the shielding electrode SSEa may be spaced apart from the i-th data line DLi. The first drive voltage line VL1, the i-th data line DLi, and the shielding electrode SSEa may be portions of a second data pattern layer 150a illustrated in FIG. 8E.

The first drive voltage line VL1 is connected with the first connecting electrode CE1a through a contact hole formed through the fourth insulating layer 40, and the i-th data line DLi is connected with the second connecting electrode CE2a through a contact hole formed through the fourth insulating layer 40.

The shielding electrode SSEa may be disposed over the first and second bridge electrodes BE1a and BE2a and may overlap the first to fourth capacitor electrodes C1-1, C1-2, C2-1, and C2-2 and the first to third transistors T1, T2, and T3. The shielding electrode SSEa may overlap the first connecting electrode CE1a and the first and second bridge electrodes BE1a and BE2a in the plan view. In the present disclosure, the first bridge electrode BE1a may correspond to the first node N1 illustrated in FIG. 6, and the second bridge electrode BE2a may correspond to the second node N2 illustrated in FIG. 6. The first and second nodes N1 and N2 may have a floating state in the low level period (that is, the light emission period) of the (2–j)th light emission control signal EM2j (refer to FIG. 2B). When the first and second nodes N1 and N2 are in the floating state, the potentials of the first and second nodes N1 and N2 may be easily shaken by an ambient signal (e.g., a data signal applied to an adjacent data line (e.g., the (i+1)th data line)). However, the first and second bridge electrodes BE1a and BE2a may be covered by the shielding electrode SSEa, and thus the shielding electrode SSEa may block an influence of the ambient signal on the first and second nodes N1 and N2.

A fifth insulating layer 50 that covers the first drive voltage line VL1, the i-th data line DLi, and the shielding electrode SSEa is disposed on the fourth insulating layer 40.

The element layer DP_ED is disposed on the circuit layer DP_CLa. Repetitive descriptions of the element layer DP_ED identical to ones given with reference to FIG. 4 will be omitted.

Figure 8E:
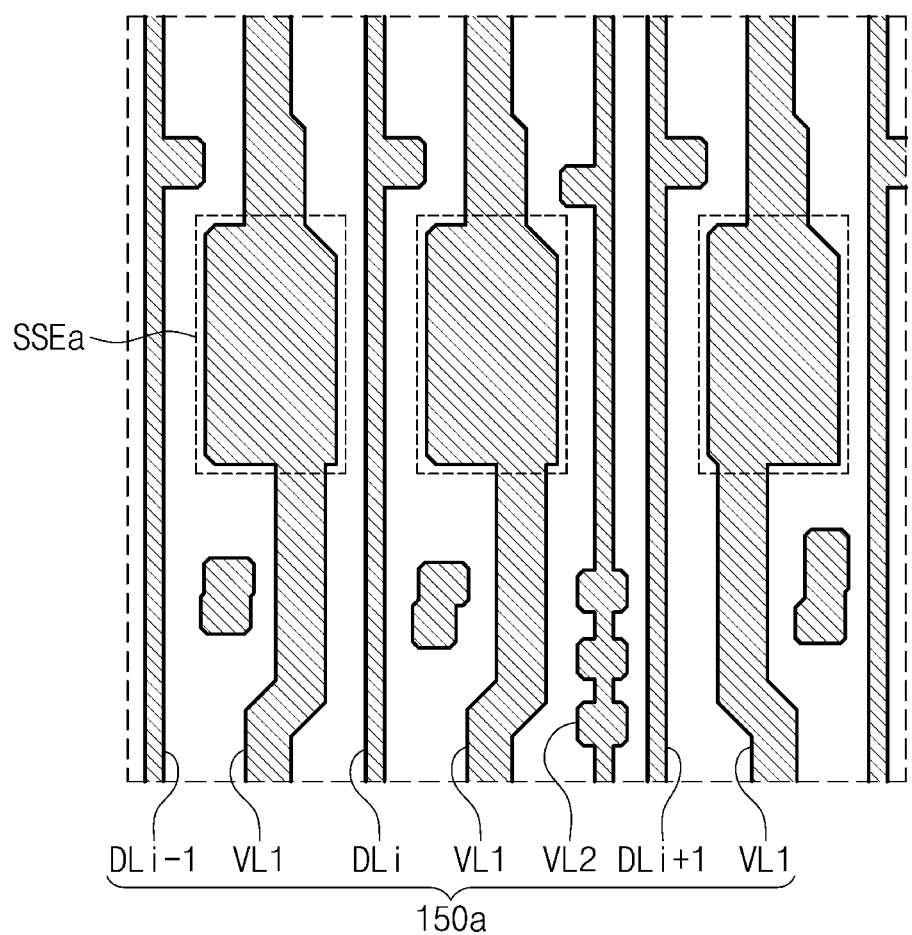
Figure 8F:
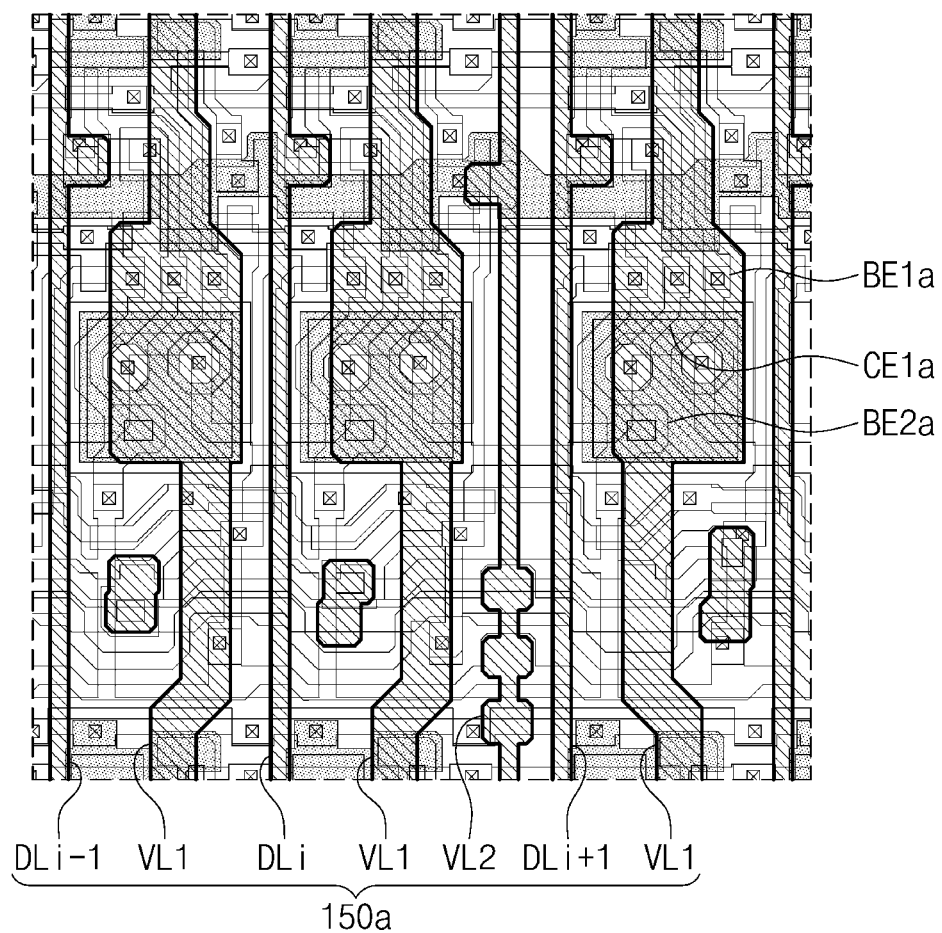
Figure 8G:
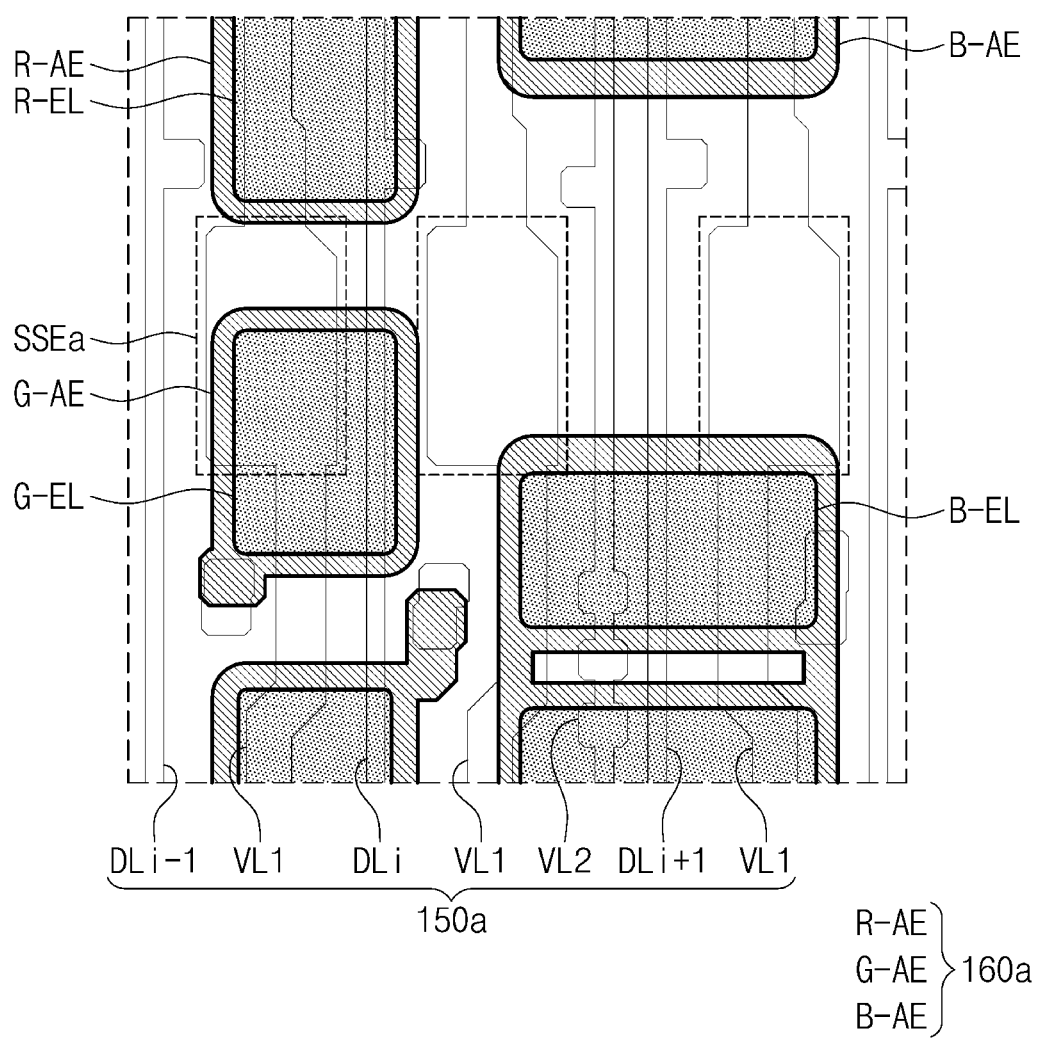

FIGS. 8A to 8G are plan views illustrating layouts of layers stacked in the display panel. Specifically, FIG. 8A is a plan view illustrating a semiconductor pattern layer and the first gate pattern layer disposed on the base layer, and FIG. 8B is a plan view illustrating the second gate pattern layer disposed on the first gate pattern layer. FIG. 8C is a plan view illustrating the additional pattern layer disposed on the second gate pattern layer, and FIG. 8D is a plan view illustrating the first data pattern layer disposed on the additional pattern layer. FIGS. 8E and 8F are plan views illustrating the second data pattern layer disposed on the first data pattern layer. FIG. 8G is a plan view illustrating an anode electrode layer disposed on the second data pattern layer.

Referring to FIG. 8A, semiconductor patterns and conductive patterns may be repeatedly arranged on the base layer BL according to a predetermined rule. Plan views of three pixel circuit units PXCa (refer to FIG. 6) are illustrated in FIGS. 8A to 8G.

Referring to FIGS. 7 and 8A, a semiconductor pattern layer 100a is illustrated. The semiconductor pattern layer 110a may be disposed on the base layer BL. The semiconductor pattern layer 100a may include low-temperature polycrystalline silicon (LTPS).

The semiconductor pattern layer 110a includes semiconductor patterns of transistors (that is, the first to tenth transistors T1 to T10) included in each pixel circuit unit PXCa. The first insulating layer 10 may be disposed on the semiconductor pattern layer 110a, and the first gate pattern layer 120a may be disposed on the first insulating layer 10.

The first gate pattern layer 120a may include the third electrodes of the transistors (that is, the first to tenth transistors T1 to T10) included in each pixel circuit unit PXCa. The first to tenth transistors T1 to T10 may be disposed in each pixel circuit unit PXCa by the first gate pattern layer 120a and the semiconductor pattern layer 110a.

The first gate pattern layer 120a may further include the first capacitor electrode C1-1 of the first capacitor C1 included in each pixel circuit unit PXCa.

Referring to FIGS. 7 and 8B, the second insulating layer 20 may be disposed on the first insulating layer 10 to cover the first gate pattern layer 120a. The second gate pattern layer 130a may be disposed on the second insulating layer 20.

The second gate pattern layer 130a may include the second capacitor electrode C1-2 of the first capacitor C1 and the third capacitor electrode C2-1 of the second capacitor C2. The first capacitor C1 may be formed in each pixel circuit unit PXCa by the first gate pattern layer 120a and the second gate pattern layer 130a.

Referring to FIGS. 7 and 8C, the additional insulating layer 25 may be disposed on the second insulating layer 20 to cover the second gate pattern layer 130a. The additional pattern layer 135a may be disposed on the additional insulating layer 25. The additional pattern layer 135a may include metal, alloy, conductive metal oxide, or a transparent conductive material.

The additional pattern layer 135a may include the fourth capacitor electrode C2-2 of the second capacitor C2. The second capacitor C2 may be formed in each pixel circuit unit PXCa by the second gate pattern layer 130a and the additional pattern layer 135a. The additional pattern layer 135a may further include a plurality of repair lines RPL. The plurality of repair lines RPL may be provided to repair lines (e.g., the scan lines and the emission control lines) provided on the display panel DPb.

Referring to FIGS. 7 and 8D, the additional insulating layer 25 may be disposed on the third insulating layer 30 to cover the additional pattern layer 135a. The first data pattern layer 140a may be disposed on the third insulating layer 30.

The first data pattern layer 140a may include the scan lines GWLj, GCLj, GILj, and GBLj, the light emission control lines EML1j and EML2j, the second-first initialization voltage line VIL2-G, the second-second initialization voltage line VIL2-RB, and the bias voltage line VBL illustrated in FIG. 6. The first data pattern layer 140a may further include the first and second bridge electrodes BE1a and BE2a and the first and second connecting electrodes CE1a and CE2a illustrated in FIG. 7.

The first bridge electrode BE1a may be an electrode that connects the first capacitor electrode C1-1 of the first capacitor C1 and the second electrode D2 of the third transistor T3, and the second bridge electrode BE2a may be an electrode that connects the second capacitor electrode C1-2 of the first capacitor C1 and the second electrode D2 of the second transistor T2. The first bridge electrode BE1a is connected with the first capacitor electrode C1-1 of the first capacitor C1 through the contact hole penetrating the second insulating layer 20, the additional insulating layer 25, and the third insulating layer 30 and is connected with the second electrode D2 of the third transistor T3 through the contact hole penetrating the first insulating layer 10, the second insulating layer 20, the additional insulating layer 25, and the third insulating layer 30. The second bridge electrode BE2a is connected with the second capacitor electrode C1-2 of the first capacitor C1 through the contact hole penetrating the additional insulating layer 25 and the third insulating layer 30 and is connected with the second electrode D2 of the second transistor T2 through the contact hole penetrating the first insulating layer 10, the second insulating layer 20, the additional insulating layer 25, and the third insulating layer 30.

Referring to FIGS. 7, 8E, and 8F, the fourth insulating layer 40 may be disposed on the third insulating layer 30 to cover the first data pattern layer 140a. The second data pattern layer 150a may be disposed on the fourth insulating layer 40.

The second data pattern layer 150a may include data lines DLi−1, DLi and DLi+1, the first vertical voltage line VL1, and the second drive voltage line VL2.

The second data pattern layer 150a may further include the shielding electrode SSEa extending from the first drive voltage line VL1. The shielding electrode SSEa may extend from the first drive voltage line VL1 and may be integrally formed (i.e., integrally provided) with the first drive voltage line VL1. The shielding electrode SSEa may extend from the first drive voltage line VL1 to overlap the first and second bridge electrodes BE1a and BE2a of the first data pattern layer 140a in a plan view.

As the first and second bridge electrodes BE1a and BE2a are covered by the shielding electrode SSEa, the shielding electrode SSEa may block an influence of an ambient signal on the first and second nodes N1 and N2.

Referring to FIGS. 7 and 8G, the fifth insulating layer 50 may be disposed on the fourth insulating layer 40 to cover the second data pattern layer 150a. The anode electrode layer 160a may be disposed on the fifth insulating layer 50. The anode electrode layer 160a may include, for example, metal, alloy, conductive metal oxide, or a transparent conductive material.

The anode electrode layer 160a may include a first anode R-AE of a first light emitting element, a second anode G-AE of a second light emitting element, and a third anode B-AE of a third light emitting element. The first light emitting element outputs first color light (e.g., red light), the second light emitting element outputs second color light (e.g., green light), and the third light emitting element outputs third color light (e.g., blue light). The light emitting element ED illustrated in FIG. 6 may be one of the first to third light emitting elements. Each of the first to third anodes R-AE, G-AE, and B-AE may be connected to a corresponding pixel circuit unit PXCa (illustrated in FIG. 6) through a contact hole.

The first light emitting element further includes a first emissive layer R-EL disposed on the first anode R-AE, the second light emitting element further includes a second emissive layer G-EL disposed on the second anode G-AE, and the third light emitting element further includes a third emissive layer B-EL disposed on the third anode B-AE.

Figure 9:
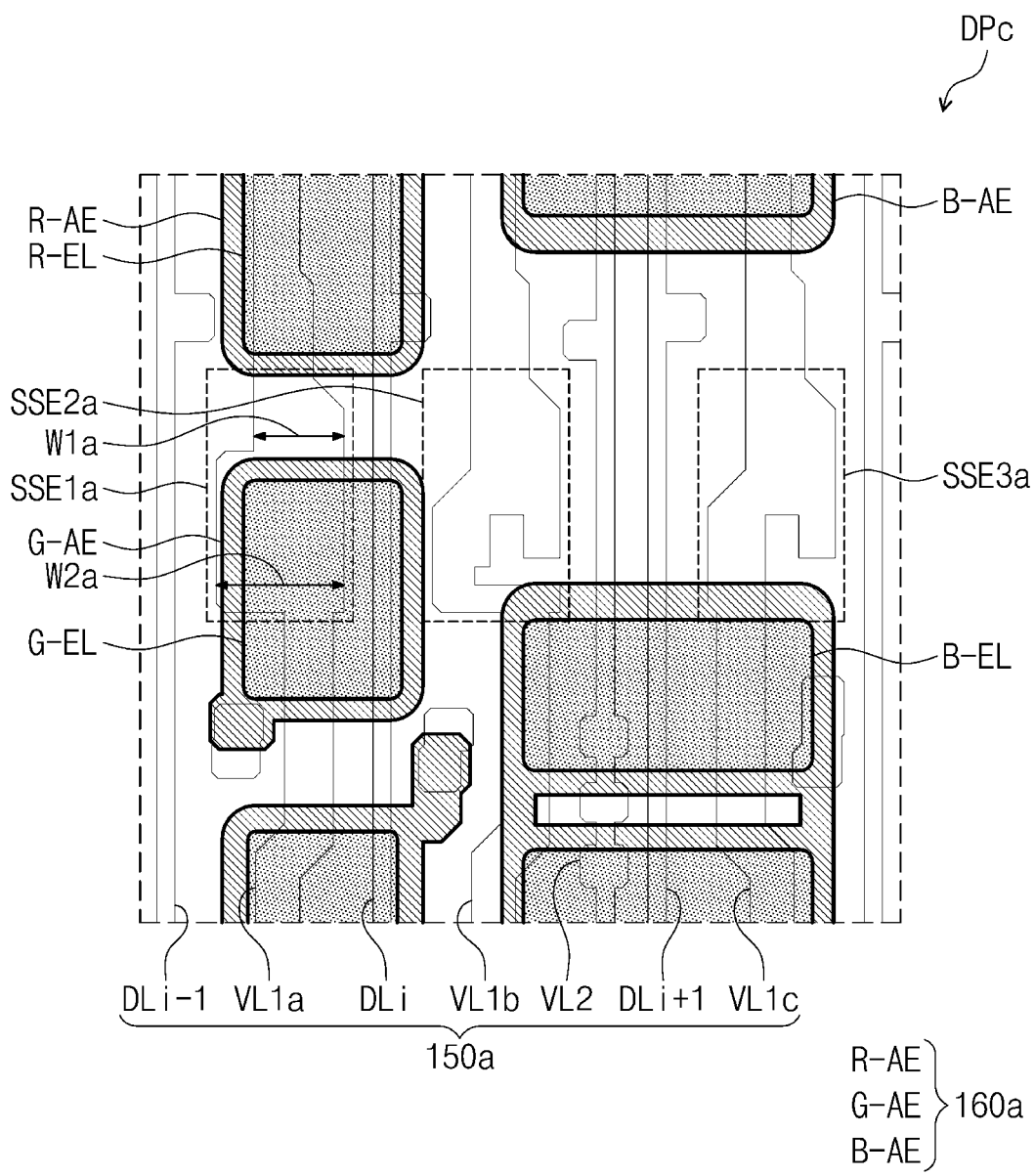
FIG. 9 is a plan view of a display panel according to an embodiment of the present disclosure.
Figure 10:
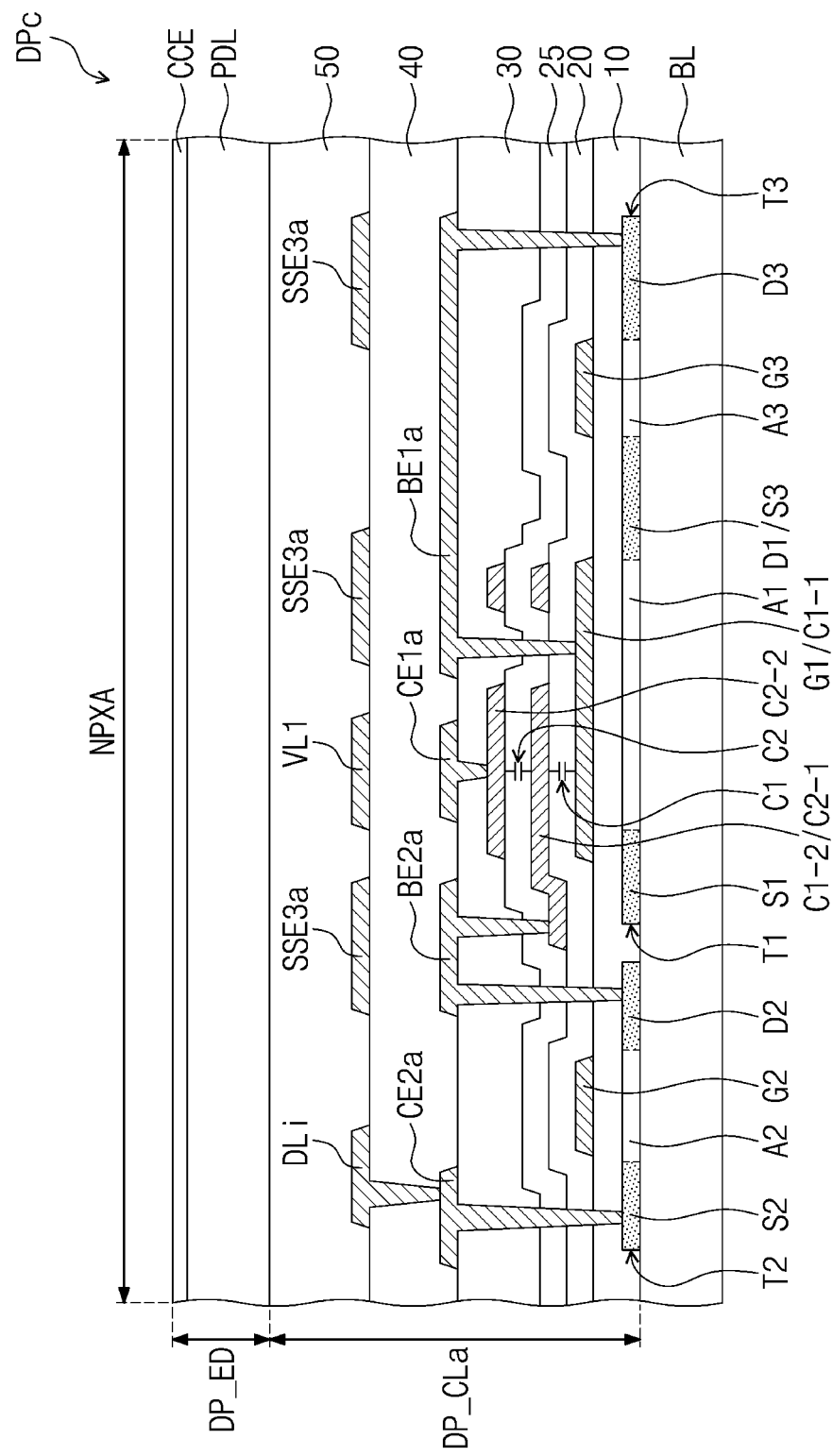
FIG. 10 is a cross-sectional view of the display panel according to still another embodiment of the present disclosure.

FIG. 9 is a plan view of a display panel according to an embodiment of the present disclosure, and FIG. 10 is a cross-sectional view of the display panel according to still another embodiment of the present disclosure. Among components illustrated in FIGS. 9 and 10, components identical to the components illustrated in FIGS. 7 and 8G will be assigned with identical reference numerals, and specific descriptions thereabout will be omitted.

Referring to FIGS. 9 and 10, the display panel DPc according to an embodiment of the present disclosure may include a first shielding electrode SSE1a, a second shielding electrode SSE2a, and a third shielding electrode SSE3a. Each of the first to third shielding electrodes SSE1a, SSE2a, and SSE3a may have an area less than an area of the shielding electrode SSEa illustrated in FIGS. 8E and 8G.

The display panel DPc may further include a first-first drive voltage line VL1a, a first-second drive voltage line VL1b, and a first-third drive voltage line VL1c. The first-first to first-third drive voltage lines VL1a, VL1b, and VL1c may be parallel to each other and may be spaced apart from each other.

The first shielding electrode SSE1a may be integrally formed with the first-first drive voltage line VL1a and may overlap at least one of first to third emissive layers R-EL, G-EL, and B-EL (e.g., the second emissive layer G-EL) in the plan view. The first shielding electrode SSE1a may partially overlap, in the plan view, at least one of the emissive regions PXA illustrated in FIG. 7. The first shielding electrode SSE1a may include a first portion overlapping the emissive region PXA and a second portion overlapping the non-emissive region NPXA illustrated in FIGS. 7 and 9, and a width w1a of the second portion may be less than a width w2a of the first portion in a plan view.

The second shielding electrode SSE2a may be integrally formed with the first-second drive voltage line VL1b and may not overlap the first to third emissive layers R-EL, G-EL, and B-EL in the plan view. The third shielding electrode SSE3a may be integrally formed with the first-third drive voltage line VL1c and may not overlap the first to third emissive layers R-EL, G-EL, and B-EL in the plan view. The second and third shielding electrodes SSE2a and SSE3a may overlap the non-emissive region NPXA in the plan view.

The areas by which the second and third shielding electrodes SSE2a and SSE3a overlap the non-emissive region are greater than the area by which the first shielding electrode SSE1a overlaps the non-emissive region in a plan view. Therefore, to improve light transmittance, the areas of the second and third shielding electrodes SSE2a and SSE3a may be designed to be less than the area of the first shielding electrode SSE1a. Accordingly, light transmittance in the non-emissive region NPXA may be increased.

However, as illustrated in FIG. 9, the first to third shielding electrodes SSE1a, SSE2a, and SSE3a may be disposed to cover first and second bridge electrodes BE1a and BE2a and a contact portion (that is, contact holes) of a first connecting electrode CE1a. Accordingly, when the first and second nodes N1 and N2 (refer to FIG. 6) are in a floating state, the first to third shielding electrodes SSE1a, SSE2a, and SSE3a may perform a shielding function so as not to be affected by an ambient signal.

According to the present disclosure, the display device includes the shielding electrode capable of shielding the first and second nodes of each pixel, thereby solving a problem of deterioration in picture quality due to an influence of an ambient signal on the first and second nodes.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
    a display panel including a light emitting element and a pixel circuit unit connected to the light emitting element,
    wherein the pixel circuit unit includes:
        a first transistor connected between a drive voltage line and the light emitting element and configured to operate depending on a potential of a first node;
        a second transistor connected between a data line and a second node;
        a first capacitor electrode electrically connected to the first node;
        a second capacitor electrode electrically connected to the second node and configured to face the first capacitor electrode to form a first capacitor with the first capacitor electrode;
        a third capacitor electrode electrically connected to the second node;
        a fourth capacitor electrode electrically connected to the drive voltage line and configured to face the third capacitor electrode to form a second capacitor with the third capacitor electrode;
        a bridge electrode configured to electrically connect the second capacitor electrode and the third capacitor electrode; and
        a shielding electrode disposed over the bridge electrode and configured to overlap the bridge electrode in a plan view.

2. The display device of claim 1, wherein the bridge electrode and the shielding electrode are disposed on different layers from each other.

3. The display device of claim 2, wherein the shielding electrode is electrically connected with the fourth capacitor electrode, and wherein the shielding electrode and the drive voltage line are disposed on a same layer, and the shielding electrode extends from the drive voltage line.

4. The display device of claim 1, wherein the bridge electrode is connected with the second capacitor electrode and the third capacitor electrode through contact holes.

5. The display device of claim 4, wherein the shielding electrode is disposed to cover the contact holes in the plan view.

6. The display device of claim 1, wherein the display panel further includes a connecting electrode configured to connect the drive voltage line and the fourth capacitor electrode.

7. The display device of claim 6, wherein the bridge electrode and the connecting electrode are disposed on a same layer.

8. The display device of claim 1, wherein the display panel includes an emissive region configured to overlap an emissive layer of the light emitting element and a non-emissive region adjacent to the emissive region, and
wherein the shielding electrode includes:
a first shielding electrode configured to overlap the emissive region; and
a second shielding electrode configured to overlap the non-emissive region.

9. The display device of claim 8, wherein the second shielding electrode has a width less than a width of the first shielding electrode in the plan view.

10. The display device of claim 9, wherein the second shielding electrode has an area less than an area of the first shielding electrode in the plan view.

11. The display device of claim 1, wherein the first capacitor electrode and the third capacitor electrode are disposed on a same layer, and
wherein the second capacitor electrode and the fourth capacitor electrode are disposed on a same layer.

12. The display device of claim 11, wherein the second capacitor electrode and the third capacitor electrode are disposed on different layers from each other.

13. The display device of claim 11, wherein the first capacitor electrode and the third capacitor electrode do not overlap each other in the plan view, and
wherein the second capacitor electrode and the fourth capacitor electrode do not overlap each other in the plan view.

14. The display device of claim 1, wherein the second capacitor electrode and the third capacitor electrode are disposed on the same layer and integrally provided with each other.

15. The display device of claim 14, wherein the first capacitor electrode and the third capacitor electrode overlap each other in the plan view, and
wherein the second capacitor electrode and the fourth capacitor electrode overlap each other in the plan view.

16. The display device of claim 1, wherein the pixel circuit unit further includes:
a third transistor connected between the first transistor and the first node; and
a fourth transistor connected between the first node and an initialization voltage line.

17. The display device of claim 16, wherein the pixel circuit unit further includes a fifth transistor connected between the second node and a reference voltage line.

18. The display device of claim 16, wherein the pixel circuit unit further includes a fifth transistor connected between the second node and the drive voltage line.

* * * * *